(12) United States Patent
Batchelor et al.

(10) Patent No.: US 7,531,898 B2
(45) Date of Patent: May 12, 2009

(54) NON-CIRCULAR VIA HOLES FOR BUMPING PADS AND RELATED STRUCTURES

(75) Inventors: William E. Batchelor, Raleigh, NC (US); Glenn A. Rinne, Apex, NC (US)

(73) Assignee: Unitive International Limited, Curacao (AN)

( * ) Notice: Subject to any disclaimer, the term of this patent is extended or adjusted under 35 U.S.C. 154(b) by 364 days.

(21) Appl. No.: 11/270,366

(22) Filed: Nov. 9, 2005

(65) Prior Publication Data

US 2006/0076679 A1 Apr. 13, 2006

Related U.S. Application Data

(60) Continuation-in-part of application No. 11/226,569, filed on Sep. 14, 2005, now Pat. No. 7,297,631, which is a division of application No. 10/601,938, filed on Jun. 23, 2003, now Pat. No. 6,960,828.

(60) Provisional application No. 60/626,802, filed on Nov. 10, 2004, provisional application No. 60/391,511, filed on Jun. 25, 2002.

(51) Int. Cl.
*H01L 23/48* (2006.01)
*H01L 23/52* (2006.01)
*H01L 29/40* (2006.01)

(52) U.S. Cl. .................. 257/737; 257/738; 257/779; 257/780

(58) Field of Classification Search ............... 257/737, 257/797, 401, 712, 717, 675, 738, 772, 779, 257/734, 780, 782
See application file for complete search history.

(56) References Cited

U.S. PATENT DOCUMENTS 162,257 A 11/1875 Yung (Continued)

FOREIGN PATENT DOCUMENTS

CN 1269607 1/2002

(Continued)

OTHER PUBLICATIONS

Invitation to Pay Additional Fees and Partial International Search Report for PCT application No. PCT/US2005/040584 mailed on Apr. 4, 2006.

(Continued)

*Primary Examiner*—Chuong A. Luu
(74) *Attorney, Agent, or Firm*—Myers Bigel Sibley & Sajovec, P.A.

(57) ABSTRACT

An integrated circuit device may include a substrate, a conductive pad on a surface of the substrate, and a conductive line on the surface of the substrate. Moreover, the conductive line may be connected to the conductive pad, and the conductive line may be narrow relative to the conductive pad. In addition, an insulating layer may be provided on the substrate, on the conductive line, and on edge portions of the conductive pad. The insulating layer may have a hole therein exposing a central portion of the conductive pad, and a first segment of a perimeter of the hole may substantially define an arc of a circle around the central portion of the conductive pad. A second segment of the perimeter of the hole may substantially deviate from the circle around the central portion of the conductive pad, and the second segment of the perimeter of the hole may be adjacent a connection between the conductive line and the conductive pad.

40 Claims, 9 Drawing Sheets

U.S. PATENT DOCUMENTS

| | | |
|---|---|---|
| 3,105,869 A | 10/1963 | Branch et al. |
| 3,244,947 A | 4/1966 | Slater |
| 3,259,814 A | 7/1966 | Green |
| 3,274,458 A | 9/1966 | Boyer et al. |
| 3,316,465 A | 4/1967 | von Bermuth et al. |
| 3,458,925 A | 8/1969 | Napier et al. |
| 3,461,357 A | 8/1969 | Mutter et al. |
| 3,489,965 A | 1/1970 | Helsdon |
| 3,501,681 A | 3/1970 | Weir |
| 3,625,837 A | 12/1971 | Nelson et al. |
| 3,663,184 A | 5/1972 | Wood et al. |
| 3,760,238 A | 9/1973 | Hamer et al. |
| 3,770,874 A | 11/1973 | Krieger et al. |
| 3,839,727 A | 10/1974 | Herdzik et al. |
| 3,871,014 A | 3/1975 | King et al. |
| 3,871,015 A | 3/1975 | Lin et al. |
| 3,897,871 A | 8/1975 | Zimnbauer |
| 3,916,080 A | 10/1975 | Wakamatsu |
| 3,942,187 A | 3/1976 | Gelsing et al. |
| 3,959,577 A | 5/1976 | Frink |
| 3,986,255 A | 10/1976 | Mandal |
| 3,993,123 A | 11/1976 | Chu et al. |
| 4,074,342 A | 2/1978 | Honn et al. |
| 4,113,578 A | 9/1978 | Del Monte |
| 4,113,587 A | 9/1978 | Chikamori |
| 4,168,480 A | 9/1979 | De Lucia |
| 4,244,002 A | 1/1981 | Sato et al. |
| 4,257,905 A | 3/1981 | Christophorou et al. |
| 4,266,282 A | 5/1981 | Henle et al. |
| 4,273,859 A | 6/1981 | Mones et al. |
| 4,382,517 A | 5/1983 | Welsch |
| 4,449,580 A | 5/1984 | Reisman et al. |
| 4,473,263 A | 9/1984 | Sunstein |
| 4,505,029 A | 3/1985 | Owyang et al. |
| 4,511,873 A | 4/1985 | Baier et al. |
| 4,532,576 A | 7/1985 | Reimer |
| 4,545,610 A | 10/1985 | Lakritz et al. |
| 4,563,697 A | 1/1986 | Miura |
| 4,565,901 A | 1/1986 | Hirooka et al. |
| 4,657,146 A | 4/1987 | Walters |
| 4,661,375 A | 4/1987 | Thomas |
| 4,673,772 A | 6/1987 | Satoh et al. |
| 4,733,813 A | 3/1988 | Le Meau et al. |
| 4,752,027 A | 6/1988 | Oschwend |
| 4,763,829 A | 8/1988 | Sherry |
| 4,783,722 A | 11/1988 | Osaki et al. |
| 4,817,850 A | 4/1989 | Wiener-Avenear et al. |
| 4,830,264 A | 5/1989 | Bitaillou et al. |
| 4,840,302 A | 6/1989 | Gardner et al. |
| 4,855,809 A | 8/1989 | Malhi et al. |
| 4,878,611 A | 11/1989 | LoVasco et al. |
| 4,893,403 A | 1/1990 | Heflinger et al. |
| 4,897,508 A | 1/1990 | Mahulikar et al. |
| 4,897,918 A | 2/1990 | Osaka et al. |
| 4,927,505 A | 5/1990 | Sharma et al. |
| 4,931,410 A | 6/1990 | Tokanaga et al. |
| 4,940,181 A | 7/1990 | Juskey, Jr. et al. |
| 4,948,754 A | 8/1990 | Kondo et al. |
| 4,950,623 A | 8/1990 | Dishon |
| 4,962,058 A | 10/1990 | Cronin et al. |
| 4,972,988 A | 11/1990 | Ohdate |
| 5,019,943 A | 5/1991 | Fassbender |
| 5,022,580 A | 6/1991 | Pedder |
| 5,024,372 A | 6/1991 | Altman et al. |
| 5,046,161 A | 9/1991 | Takada |
| 5,048,747 A | 9/1991 | Clark et al. |
| 5,113,314 A | 5/1992 | Wheeler et al. |
| 5,130,275 A | 7/1992 | Dion |
| 5,130,779 A | 7/1992 | Agarwala et al. |
| 5,135,155 A | 8/1992 | Kang et al. |
| 5,147,084 A | 9/1992 | Behun et al. |
| 5,152,451 A | 10/1992 | Darveaux et al. |
| 5,154,341 A | 10/1992 | Melton et al. |
| 5,160,409 A | 11/1992 | Moore et al. |
| 5,162,257 A | 11/1992 | Yung |
| 5,171,711 A | 12/1992 | Tobimatsu |
| 5,194,137 A | 3/1993 | Moore et al. |
| 5,211,807 A | 5/1993 | Yee |
| 5,216,280 A | 6/1993 | Tanaka et al. |
| 5,227,664 A | 7/1993 | Toshio et al. |
| 5,234,149 A | 8/1993 | Katz et al. |
| 5,239,447 A | 8/1993 | Cotues et al. |
| 5,240,881 A | 8/1993 | Cayetano et al. |
| 5,250,843 A | 10/1993 | Eichelberger |
| 5,251,806 A | 10/1993 | Agarwala et al. |
| 5,252,781 A | 10/1993 | Shirai et al. |
| 5,289,925 A | 3/1994 | Newmark |
| 5,293,006 A | 3/1994 | Yung |
| 5,325,265 A | 6/1994 | Turlik et al. |
| 5,327,013 A | 7/1994 | Moore et al. |
| 5,327,327 A | 7/1994 | Frew et al. |
| 5,329,068 A | 7/1994 | Hirata et al. |
| 5,335,795 A | 8/1994 | Chizen |
| 5,347,428 A | 9/1994 | Carson et al. |
| 5,354,711 A | 10/1994 | Heitzmann et al. |
| 5,381,946 A | 1/1995 | Koopman et al. |
| 5,391,514 A | 2/1995 | Gall et al. |
| 5,406,701 A | 4/1995 | Pepe et al. |
| 5,409,862 A | 4/1995 | Wada et al. |
| 5,424,920 A | 6/1995 | Miyake |
| 5,432,729 A | 7/1995 | Carson et al. |
| 5,453,582 A | 9/1995 | Amano et al. |
| 5,462,638 A | 10/1995 | Datta et al. |
| 5,470,787 A | 11/1995 | Greer |
| 5,471,092 A | 11/1995 | Chan et al. |
| 5,475,280 A | 12/1995 | Jones et al. |
| 5,492,235 A | 2/1996 | Crafts et al. |
| 5,539,186 A | 7/1996 | Abrami et al. |
| 5,542,174 A | 8/1996 | Chiu |
| 5,547,740 A | 8/1996 | Higdon et al. |
| 5,551,627 A | 9/1996 | Leicht et al. |
| 5,553,769 A | 9/1996 | Ellerson et al. |
| 5,557,502 A | 9/1996 | Bannerjee et al. |
| 5,609,287 A | 3/1997 | Izuta et al. |
| 5,616,962 A | 4/1997 | Ishikawa et al. |
| 5,627,396 A | 5/1997 | James et al. |
| 5,634,268 A | 6/1997 | Dalal et al. |
| 5,680,296 A | 10/1997 | Hileman et al. |
| 5,736,456 A | 4/1998 | Akram |
| 5,739,053 A | 4/1998 | Kawakita et al. |
| 5,744,382 A | 4/1998 | Kitayama et al. |
| 5,751,556 A | 5/1998 | Butler et al. |
| 5,759,437 A | 6/1998 | Datta et al. |
| 5,773,359 A | 6/1998 | Mitchell et al. |
| 5,793,116 A | 8/1998 | Rinne et al. |
| 5,796,168 A | 8/1998 | Datta et al. |
| 5,796,591 A | 8/1998 | Dalal et al. |
| 5,812,378 A | 9/1998 | Fjelstad et al. |
| 5,851,911 A | 12/1998 | Farnworth |
| 5,859,470 A | 1/1999 | Ellerson et al. |
| 5,886,393 A | 3/1999 | Merrill et al. |
| 5,891,756 A | 4/1999 | Erickson |
| 5,892,179 A | 4/1999 | Rinne et al. |
| 5,898,574 A | 4/1999 | Tan et al. |
| 5,902,686 A | 5/1999 | Mis |
| 5,906,312 A | 5/1999 | Zakel et al. |
| 5,920,125 A | 7/1999 | Ellerson et al. |
| 5,923,539 A | 7/1999 | Matsui et al. |
| 5,937,320 A | 8/1999 | Andricacos et al. |
| 5,963,793 A | 10/1999 | Rinne et al. |
| 5,990,472 A | 11/1999 | Rinne |
| 6,015,505 A | 1/2000 | David et al. |
| 6,027,957 A | 2/2000 | Merritt et al. |
| 6,083,773 A | 7/2000 | Lake |

| | | | | | | |
|---|---|---|---|---|---|---|
| 6,117,299 | A | 9/2000 | Rinne et al. | EP | 0 609 062 A1 | 8/1994 |
| 6,121,069 | A | 9/2000 | Boyko et al. | EP | 0 736 972 A1 | 10/1996 |
| 6,133,065 | A | 10/2000 | Akram | EP | 0 782 191 A2 | 2/1997 |
| 6,134,120 | A | 10/2000 | Baldwin | EP | 0757386 | 2/1997 |
| 6,162,652 | A | 12/2000 | Dass et al. | EP | 0 782 191 | 7/1997 |
| 6,169,325 | B1 | 1/2001 | Azuma et al. | EP | 0 782 191 A2 | 7/1997 |
| 6,208,018 | B1 | 3/2001 | Ma et al. | EP | 0 907 207 | 4/1999 |
| 6,221,682 | B1 | 4/2001 | Danziger et al. | EP | 1 148 548 | 10/2001 |
| 6,222,279 | B1 | 4/2001 | Mis et al. | EP | 1146552 | 10/2001 |
| 6,224,690 | B1 | 5/2001 | Andricacos et al. | FR | 2 406 893 | 10/1978 |
| 6,231,743 | B1 | 5/2001 | Etherington | FR | 2 688 628 | 9/1993 |
| 6,232,668 | B1 | 5/2001 | Hikita et al. | FR | 2 705 832 | 12/1994 |
| 6,238,951 | B1 | 5/2001 | Caillat | GB | 1288564 | 9/1972 |
| 6,281,106 | B1 | 8/2001 | Higdon et al. | GB | 2062 963 | 5/1981 |
| 6,320,262 | B1 | 11/2001 | Murakami | GB | 2 194 387 | 3/1988 |
| 6,329,608 | B1 | 12/2001 | Rinne et al. | JP | 54050269 | 4/1979 |
| 6,332,988 | B1 | 12/2001 | Berger, Jr. et al. | JP | 54-128669 | 10/1979 |
| 6,335,104 | B1 | 1/2002 | Sambucetti et al. | JP | 55-111127 | 8/1980 |
| 6,346,469 | B1 | 2/2002 | Greer | JP | 57-73952 | 5/1982 |
| 6,388,203 | B1 | 5/2002 | Rinne et al. | JP | 57-197838 | 12/1982 |
| 6,389,691 | B1 | 5/2002 | Rinne et al. | JP | 59-154041 | 9/1984 |
| 6,392,163 | B1 | 5/2002 | Rinne et al. | JP | 6-116552 | 1/1986 |
| 6,415,974 | B2 | 7/2002 | Jao | JP | 63-222445 | 9/1988 |
| 6,418,033 | B1 | 7/2002 | Rinne | JP | 1-94696 | 4/1989 |
| 6,419,974 | B1 | 7/2002 | Silva et al. | JP | 01 094696 | 4/1989 |
| 6,440,291 | B1 | 8/2002 | Henri et al. | JP | 01094696 | 4/1989 |
| 6,441,487 | B2 | 8/2002 | Elenius et al. | JP | 01094696 | 7/1989 |
| 6,452,270 | B1 | 9/2002 | Huang | JP | 0 4 133330 | 5/1992 |
| 6,452,271 | B2 | 9/2002 | Jiang et al. | JP | 4-150033 | 5/1992 |
| 6,475,896 | B1 | 11/2002 | Hashimoto | JP | 07066207 | 1/1994 |
| 6,476,494 | B1 | 11/2002 | Hur et al. | JP | 0 7 226400 | 8/1995 |
| 6,492,197 | B1 | 12/2002 | Rinne | JP | 63099558 | 4/1998 |
| 6,495,018 | B1 | 12/2002 | Lowe | JP | 2000349111 | 12/2000 |
| 6,521,996 | B1 | 2/2003 | Seshan | JP | 2002203868 | 7/2002 |
| 6,617,655 | B1 | 9/2003 | Estacio et al. | WO | WO93/02831 | 2/1993 |
| 6,620,722 | B2 | 9/2003 | Kuo et al. | WO | WO93/22475 | 11/1993 |
| 6,622,907 | B2 | 9/2003 | Fanti et al. | WO | WO 96/30933 | 10/1996 |
| 6,668,449 | B2 | 12/2003 | Rumsey et al. | WO | WO96/31905 | 10/1996 |
| 6,762,122 | B2 | 7/2004 | Mis et al. | WO | WO 97/03465 | 1/1997 |
| 6,793,792 | B2 | 9/2004 | Jones et al. | WO | WO 97/45871 | 12/1997 |
| 6,828,510 | B1 * | 12/2004 | Asai et al. ............ 174/255 | WO | WO98/06118 | 2/1998 |
| 6,835,643 | B2 | 12/2004 | Akram | WO | WO 02/03461 | 1/2002 |
| 6,853,076 | B2 | 2/2005 | Datta et al. | | | |
| 2001/0011764 | A1 | 8/2001 | Elenius et al. | | | |
| 2001/0020745 | A1 | 9/2001 | Jiang et al. | | | |
| 2001/0042918 | A1 | 11/2001 | Yanagida | | | |
| 2002/0000665 | A1 | 1/2002 | Barr et al. | | | |
| 2002/0056742 | A1 | 5/2002 | Rinne | | | |
| 2002/0079576 | A1 | 6/2002 | Seshan | | | |
| 2002/0086520 | A1 | 7/2002 | Chiang | | | |
| 2002/0093098 | A1 | 7/2002 | Barr et al. | | | |
| 2002/0096764 | A1 | 7/2002 | Huang | | | |
| 2002/0197842 | A1 | 12/2002 | Kuo et al. | | | |
| 2003/0000738 | A1 | 1/2003 | Rumsey et al. | | | |
| 2003/0027379 | A1 | 2/2003 | Liu | | | |
| 2003/0060040 | A1 | 3/2003 | Lee et al. | | | |
| 2003/0107137 | A1 | 6/2003 | Stierman et al. | | | |
| 2003/0124833 | A1 | 7/2003 | Tong et al. | | | |
| 2003/0143830 | A1 | 7/2003 | Akram | | | |
| 2003/0143861 | A1 | 7/2003 | Kassir | | | |
| 2003/0186487 | A1 | 10/2003 | Hogerl | | | |
| 2003/0218246 | A1 | 11/2003 | Abe et al. | | | |
| 2004/0023450 | A1 | 2/2004 | Katagiri et al. | | | |
| 2004/0053483 | A1 | 3/2004 | Nair et al. | | | |
| 2005/0012222 | A1 | 1/2005 | Huang | | | |

FOREIGN PATENT DOCUMENTS

| | | |
|---|---|---|
| DE | 42 05 029 C | 2/1993 |
| DE | 43 23 799 A1 | 1/1994 |
| DE | 197 41 436 | 12/1998 |
| EP | 0 355 478 | 2/1990 |
| EP | 0 603 296 | 6/1994 |

OTHER PUBLICATIONS

Howell et al: "Area Array Solder Interconnection Technology for the Three-Dimensional Silicon Cube", Proceedings of the 1995 45th Electronic Components & Technology Conference, pp. 1174-1178.

Lineback, "3D IC Packaging Moves Cloers to Commerical Use", Electronic World News, May 21, 1990, p. 15.

Multimedia Card Association, www.mmca.org.

SanDisk Corporation, SanDisk Flash Data Storage, San Disk Compact Flash™ and MultiMedia Card: Small Form Factor Solutions, 1999.

Guckel et al., *Electromagnetic Linear Actuators with Inductive Position Sensing for Micro Relay, Micro Value and Precision Positioning Applications*, Transducers '95, Eurosensors IX, The 8th International Conference on Solid-State Sensors and Actuators, and Eurosensors IX, pp. 324-327.

Hashimoto et al; *Thermally Controlled Magnetization Microrelay*, Transducers '95, Eurosensors IX, The 8th International Conference on Solid-State Sensors and Actuators, and Eurosensors IX, pp. 361-364.

Drake et al; *An Electrostatically Acutated Micro-Relay*, Transducers '95, Eurosensors IX, The 8th International Conference on Solid-State Sensors and Actuators, and Eurosensors IX, pp. 380-383.

Knüppel, *Rugged Design for Reliable Switching: Micro a Relay Sets New Automotive Standards*, Components XXIX (1994), No. 4, pp. 30-32.

Hosaka et al; Electromagnetic Microrelays: Concepts and Fundamental Characteristics, Sensors and Actuators A, 40 (1994), pp. 41-47.

Specification Sheet, *NaiS, Ultra Low Profile 2 Amp-Polarized Relay*, TK-Relays.

PCB Assembly, *Electronic Packaging & Production*, vol. 35, No. 1, p. 40 (Jan. 1995).

Adema et al., *Flip Chip Technology: A Method for Providing Known Good Die with High Density Interconnections*, MCM '94 Proceedings, pp. 41-49.

Datta et al., *Electrochemical Fabrication of Mechanically Robust PbSn C4 Interconnections*, J. Electrochem. Soc., vol. 142, No. 11, The Electrochemical Society, Inc., Nov. 1995, pp. 3779-3785.

Hirsch, *Tin-Lead, Lead and Tin Plating*, Metal Finishing, Guidebook Directory 1987, 55th Guidebook-Directory Issue 1987, Mid Jan. 1987, vol. 85, No. 1A, ISSN 0026-0576, pp. 280-284.

Inaba et al; *Solder Bump Formation Using Electroless Plating and Ultrasonic Soldering*, IEEE Transactions on Components, Hybrids, and Manufacturing Technology, vol. 13, No. 1, Mar. 1990, pp. 119-123.

K. Yung et al; *Electroplated Solder Joints for Flip-Chip Applications*, Transactions on Components, Hybrids, and Manufacturing Technology, vol. 14, No. 3, Sep. 1991, pp. 549-559.

E. K. Yung et al; *Flip-Chip Process Utilizing Electroplated Solder Joints*, Proceedings of the Technical Conference, 1990 International Electronics Packaging Conference, Sep. 10-12, 1990, pp. 1065-1079.

T.G. Tessier et al; *Process Considerations in Fabricating Thin Film Multi-chip Modules*, Proceedings of the Technical Conference 1989 International Electronics Packaging Conference, 1989.

PCT International Search Report dated Dec. 9, 1992 of International Appln. No. PCT/US 92/07722 filed Sep. 11, 1992.

Edelstein, D.C., et al; Derwent Publications Ltd. London, GB: AN 2002-308284 XP-002243726.

International Search Report for PCT/US 02/30697.

Jean Audel, et al; *Low Cost Bumping Process for Flip Chip*, Proc. 1995 International Flip Chip, BGA, and Ado Pkg. Symposium ITAP 95, '95 Flip Chip, BGA, TAB & AP Symposium, pp. 16-21 (1995).

J.D. Mis, et al; *Flip Chip Production Experience: Some Design, Process, Reliability, and Cost Considerations, ISHM '96 Proceedings*, Proc. 1996 International Symposium on Microelectronics SPIE vol. 2920, pp. 291-295 (1996).

S.K. Kang, et al; *Interfacial Reactions During Soldering With Lead-Tin Eutectic and Lead (Pb)-Free, Tin-Rich Solders, Journal of Electronic Materials*, vol. 25, No. 7, pp. 1113-1120 (1996).

Eric Jung, et al., *The influence of NiSn Intermetallics on the Performance of Flip Chip Contacts Using a Low Cost Electroless Nickel Bumping Approach*, IEPS Proceedings of the Technical Conference, 1996 Electronics Packaging Conference, Austin, Texas, pp. 14-25 (Sep. 29-Oct. 1, 1996).

International Search Report for PCT/US 03/20790.

W.J. Choi et al; *Electromigration of Flip Chip Solder Bump on Cu/Ni(v) A1 Thin Film Under Bump Metallization*; 2002 Electronic Components and Technology Conference; pp. 1201-1205.

K. Zeng et al; *Six cases of reliability study of Pb-free solder joints in electronic packaging technology*, Reports: A Review Journal; Materials Science and Engineering R 38 (2002) pp. 55-105.

International Search Report and Written Opinion for PCT/US2005/040584 mailed May 24, 2006.

PCT International Search Report for PCT/US2005/040584 (Apr. 4, 2006).

Arai et al. "Sn-Ag Solder Bump Formation for Flip-Chip Bonding by Electroplating" *Journal of the Electrochemical Society* 150(10): c730-c734 (2003).

Chan "Investigation of Cr/Cu/Cu/Ni Under Bump Metallization for Lead-free Applications" *2002 Electronics Packaging Technology Conference* 270-275 (2002).

Data et al. "Electrochemical Fabrication of Mechanically Robust PbSn C4 Interconnections" *Journal of the Electrochemical Society* 142(11):3779-3785 (1995).

Danzl et al. "The Use of Concentrated Hydrogen Peroxide for the Removal of a TiW ARC from Aluminum Bond Pads" *IEEE/CPMT International Electronics Manufacturing Technology Symposium* 99-104 (1997).

Ezawa et al. "Eutectic Sn-Ag Solder Bump Process for ULSI Flip Chip Technology" *IEEE Transactions on Electronics Packaging Manufacturing* 24(4): 275-281 (2001).

Ezawa et al "Pb-Free Bumping by Alloying Electroplated Metal Stacks" *Electronics Components and Technology Conference* 664-667 (2003).

Furuya et al. "TI Concentration Effect on Adhesive Energy at Cu/TiW Interface" *Journal of Applied Physics* 84 (9): 4941-4944 (1998).

Graf "The Modern Dictionary of Electronics" Sixth Edition p. 386 (1984).

Greer "An Extended Eutectect Solder Bump for FCOB" *Electronic Components and Technology Conference* 546-551 (1996).

Hawley et al. "Solutions to Catastrophic Yield Problems in MCM-D Interconnect Production" *International Conference on Multichip Modules and High Density Packaging* 118-123 (1998).

International Search Report and Written Opinion of the International Search Authority for International Patent Application No. PCT/US2005/023041 mailed on Oct. 11, 2005.

International Search Report and Written Opinion of the International Searching Authority for International Application No. PCT/US2005/012029 mailed on Oct. 28, 2005.

International Search Report for PCT/US01/43948 mailed Apr. 1, 2003.

Invitation to Pay Additional Fees and Partial International Search Report for International Patent Application No. PCT/US2005/012029 mailed on Jul. 26, 2005.

Kim et al. "Electrodeposition of Near-Eutectic SnAg Solders for Wafer-Level Packaging" *Journal of The Electrochemical Society* 150(9): c577-c584 (2003).

Kiumi et al. "Processing, Properties, and reliability of electroplated Lead-Free Solder Bumps" *IEEE 2002 Inter Society Conference on Thermal Phenomena* 909-914 (2002).

Solomon "Providing high Density and Performance for Chip-to System Interconnection" *Advanced Packaging* 19-28 (2001).

* cited by examiner

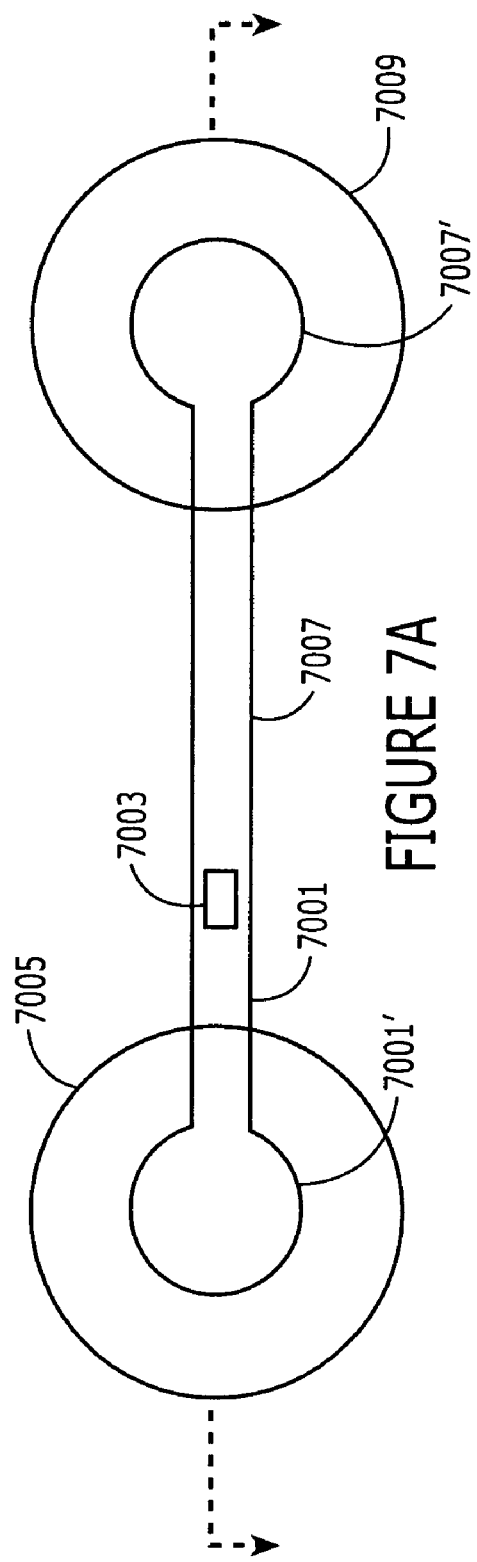
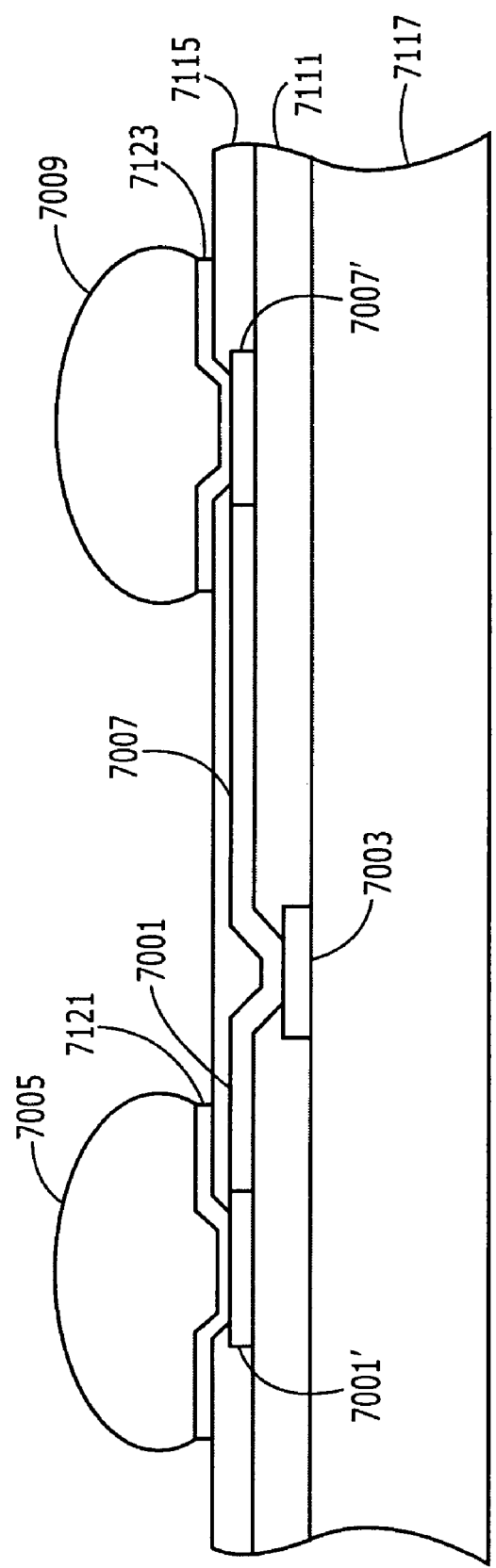

US 7,531,898 B2

NON-CIRCULAR VIA HOLES FOR BUMPING PADS AND RELATED STRUCTURES

RELATED APPLICATIONS

The present application claims the benefit of priority as a Continuation-In-Part (CIP) application from U.S. Utility application Ser. No. 11/226,569 filed Sep. 14, 2005 now U.S. Pat. No. 7,297,631, which claims the benefit of priority as a Divisional application from U.S. Utility patent application Ser. No. 10/601,938 filed Jun. 23, 2003, now U.S. Pat. No. 6,960,828, which claims the benefit of priority from U.S. Provisional Application No. 60/391,511 filed Jun. 25, 2002. The present application also claims the benefit of priority from U.S. Provisional Application No. 60/626,802 filed Nov. 10, 2004. The disclosures of each of the above referenced utility and provisional applications are hereby incorporated herein in their entirety by reference.

FIELD OF THE INVENTION

The present invention relates to the field of electronics, and more particularly to electronic structures including solder layers and related methods.

BACKGROUND

Solder layers may be used to provide electrical and mechanical coupling between two electronic substrates, such as in flip-chip bonding. In particular, a solder layer may be provided on a conductive pad of an electronic substrate (such as an input/output pad of an integrated circuit substrate), and the solder layer can be used to bond the electronic substrate to a next level of packaging such as a printed circuit board, a ceramic substrate, and/or another integrated circuit device. Accordingly, the solder layer may provide an electrical interconnection between the electronic substrate and the next level of packaging.

More particularly, a solder bump may be provided on a portion of a conductive pad exposed through a via in an insulating layer. In addition, a relatively thin underbump metallurgy (UBM) layer may promote adhesion, provide a plating electrode, and/or provide a routing conductor. An insulating layer on the electronic structure may include a via therein exposing a portion of the conductive pad on which the solder layer is provided. As current flowing in a conventional structure reaches an edge of a solder bump via, a lower resistance of the bump may cause most of the current to turn the corner at the via edge. A non-uniform current density may result, and a non-uniform current density may reduce reliability.

More particularly, a relatively high current density at the via edge may accelerate local electromigration of the solder layer at the via edge. Solder, for example, may be particularly susceptible to electromigration because of its relatively low melting temperature. Diffusion of metal in the solder layer away from the via edge may result in formation of a void in the solder layer adjacent the via edge. The void may block current flow thus forcing the current to travel farther past the via edge before turning toward the solder. Accordingly, a void may grow laterally along an interface between the solder and the conductive pad.

Solder layers may be relatively sensitive to electromigration as discussed, for example, by W. J. Choi et al. in "Electromigration Of Flip Chip Solder Bump On Cu/Ni(V)/Al Thin Film Under Bump Metallization" (Proceedings of the IEEE Electronic Components Technology Conference, 2002). The disclosure of the Choi et al. reference is hereby incorporated herein in its entirety by reference.

SUMMARY

According to some embodiments of the present invention, an integrated circuit device may include a substrate, a conductive pad on a surface of the substrate, and a conductive line on the surface of the substrate. The conductive line may be connected to the conductive pad, and the conductive line may be narrow relative to the conductive pad. An insulating layer may be provided on the substrate, on the conductive line, and on edge portions of the conductive pad, and the insulating layer may have a hole therein exposing a central portion of the conductive pad. In addition, a first segment of a perimeter of the hole may substantially define an arc of a circle around the central portion of the conductive pad, and a second segment of the perimeter of the hole may substantially deviate from the circle around the central portion of the conductive pad. Moreover, the second segment of the perimeter of the hole may be adjacent a connection between the conductive line and the conductive pad.

A conductive bump may be provided on the central portion of the conductive pad and on portions of the insulating layer surrounding the hole so that the insulating layer is between the conductive bump and edge portions of the conductive pad. Moreover, the conductive bump may include a solder bump, and/or the conductive bump may have a substantially circular footprint on the insulating layer. In addition, an underbump metallurgy layer may be provided on the central portion of the conductive pad and on portions of the insulating layer surrounding the hole so that the under bump metallurgy layer is between the conductive bump and portions of the insulating layer surrounding the hole, and the underbump metallurgy layer and the conductive bump may comprise different materials.

An input/output pad may be provided on the substrate, and the conductive line may provide electrical connection between the conductive pad and the input/output pad. In addition, a second conductive line may be connected to the input/output pad, and a second conductive pad may be connected to the second conductive line wherein the insulating layer has a second hole therein exposing a central portion of the second conductive pad. In addition, a first conductive bump may be provided on the central portion of the first conductive pad and on portions of the insulating layer surrounding the first hole, and a second conductive bump may be provided on the central portion of the second conductive pad and on portions of the insulating layer surrounding the second hole.

According to some embodiments of the present invention, the second segment of the perimeter of the hole may substantially define a line, and a length of the second segment may be at least as great as a width of the conductive line. According to other embodiments of the present invention, the second segment of the perimeter of the hole may curve toward the center of the conductive pad.

According to additional embodiments of the present invention, an integrated circuit device may include a substrate, a conductive pad on a surface of the substrate, and a conductive line on the surface of the substrate. The conductive line may be connected to the conductive pad, and the conductive line may be narrow relative to the conductive pad. An insulating layer may be provided on the substrate, on the conductive line, and on edge portions of the conductive pad, the insulating layer may have a hole therein exposing a central portion of the conductive pad, and at least a segment of a perimeter of the hole may be non-circular. In addition, a conductive bump may be provided on the central portion of the conductive pad and on portions of the insulating layer surrounding the hole so that the insulating layer is between the conductive bump and edge portions of the conductive pad and so that the conductive bump has a substantially circular footprint on the insulating layer.

More particularly, the conductive bump may include a solder bump. In addition, an underbump metallurgy layer may be provided on the central portion of the conductive pad and on portions of the insulating layer surrounding the hole so that the under bump metallurgy layer is between the conductive bump and portions of the insulating layer surrounding the hole. Moreover, the underbump metallurgy layer and the conductive bump may include different materials.

A first segment of a perimeter of the hole may substantially define an arc of a circle around the central portion of the conductive pad, and a second segment of the perimeter of the hole may substantially deviate from the circle around the central portion of the conductive pad. The second segment of the perimeter of the hole may be adjacent a connection between the conductive line and the conductive pad. According to some embodiments of the present invention, the second segment of the perimeter of the hole may substantially define a line, and a length of the second segment may be at least as great as a width of the conductive line. In other embodiments of the present invention, the second segment of the perimeter of the hole may curve toward the center of the conductive pad. Moreover, an input/output pad may be provided on the substrate wherein the conductive line provides electrical connection between the conductive pad and the input/output pad.

In addition, the integrated circuit device may include a second conductive line connected to the input/output pad, and a second conductive pad connected to the second conductive line wherein the insulating layer has a second hole therein exposing a central portion of the second conductive pad. A first conductive bump may be provided on the central portion of the first conductive pad and on portions of the insulating layer surrounding the first hole, and a second conductive bump may be provided on the central portion of the second conductive pad and on portions of the insulating layer surrounding the second hole.

According to additional embodiments of the present invention, an integrated circuit device may include a substrate, an input/output pad on the substrate, and first and second conductive lines on the substrate with both of the first and second lines being connected to the input/output pad. First and second conductive pads may be provided on the substrate with the first conductive pad being connected to the first conductive line and with the second conductive pad being connected to the second conductive line. An insulating layer may be provided on the first and second conductive lines and on edge portions of the first and second conductive pads, and the insulating layer may have first and second holes therein exposing central portions of the respective first and second conductive pads. In addition, a first conductive bump may be provided on the central portion of the first conductive bump and on portions of the insulating layer surrounding the first hole, and a second conductive bump may be provided on the central portion of the second conductive pad and on portions of the insulating layer surrounding the second hole.

The first and second conductive bumps may include respective first and second solder bumps, and each of the first and second conductive bumps may have a substantially circular footprint on the insulating layer. In addition, a first underbump metallurgy layer may be provided on the central portion of the first conductive pad and on portions of the insulating layer surrounding the first hole so that the first under bump metallurgy layer is between the first conductive bump and portions of the insulating layer surrounding the first hole, and the first underbump metallurgy layer and the first conductive bump may include different materials. A second underbump metallurgy layer may be provided on the central portion of the second conductive pad and on portions of the insulating layer surrounding the second hole so that the second under bump metallurgy layer is between the second conductive bump and portions of the insulating layer surrounding the second hole, and the second underbump metallurgy layer and the second conductive bump may include different materials.

The first conductive line may provide a first electrical resistance between the input/output pad and the first conductive pad, the second conductive line may provide a second electrical resistance between the input/output pad and the second conductive pad, and the first and second electrical resistances may be different. According to some embodiments of the present invention, the first conductive line may have a first length between the input/output pad and the first conductive pad, the second conductive line may have a second length between the input/output pad and the second conductive pad, and the first and second lengths may be different. According to some other embodiments of the present invention, the first conductive line may have a first width, the second conductive line may have a second width, and the first and second widths may be different. According to still other embodiments of the present invention, the first conductive line may have a first thickness, the second conductive line may have a second thickness, and the first and second thicknesses may be different. According to yet other embodiments of the present invention, the first conductive line may include a first material, the second conductive line may include a second material, and the first and second materials may be different.

The input/output pad may be a ground pad providing a ground connection for the integrated circuit device, or the input/output pad may be a power pad providing a power connection for the integrated circuit device. The first conductive line may be narrow relative to the first conductive pad, a first segment of a perimeter of the first hole may substantially define an arc of a circle around the central portion of the first conductive pad, and a second segment of the perimeter of the first hole may substantially deviate from the circle around the central portion of the conductive pad. Moreover, the second segment of the perimeter of the first hole may be adjacent a connection between the conductive line and the conductive pad. Moreover, at least a segment of a perimeter of the first hole may be non-circular.

BRIEF DESCRIPTION OF THE DRAWINGS

FIGS. 7A-B are respective top and cross sectional views illustrating multiple bumps connected to an input/output pad according to some additional embodiments of the present invention.

DETAILED DESCRIPTION

Figure 1A:
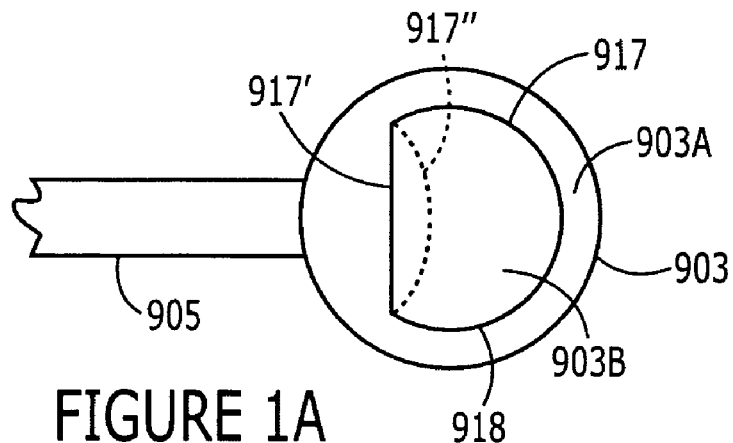
FIG. 1A is a top view illustrating a conductive line and pad according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. Similarly, when an element such as a layer, region or substrate is referred to as being coupled or connected to/with another element, it can be directly coupled or connected to/with the other element or intervening elements may also be present. In contrast, if an element such as a layer, region or substrate is referred to as being directly coupled or connected to/with another element, then no other intervening elements are present. As used herein, the term "and/or" includes any and all combinations of one or more of the associated listed items. The symbol "/" is also used as a shorthand notation for "and/or".

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Moreover, a patterned feature (such as a perimeter of a hole) illustrated having sharp transitions may typically have a rounded or curved transition. Thus, the regions illustrated in the figures are schematic in nature and their shapes are not intended to illustrate the actual shape of a region of a device and are not intended to limit the scope of the invention.

Furthermore, relative terms, such as beneath, upper, lower, top, and/or bottom may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes", and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

Several approaches are discussed to reduce electromigration. According to embodiments of the present invention, effects of electromigration can be reduced by using more power or ground bumps depending on an expected operating temperature of a solder bump interconnection (such as a SnPb solder bump interconnection) because segregation of lead and tin may be a risk at the cathode below 100 degrees C. and at the anode above 100 degrees C. due to the relative diffusivities of the two components.

More particularly, diffusivities of lead and tin in a lead-tin solder may vary over temperature, with lead diffusing faster than tin at temperatures greater than approximately 100 degrees C. and with tin diffusing faster than lead at temperatures less than approximately 100 degrees C. Moreover, a faster diffusing component of the solder metallurgy may tend to segregate toward a positive terminal (i.e., an anode) of the solder bump, and/or a slower diffusing component of the solder metallurgy may tend to segregate toward a negative terminal (i.e., a cathode) of the solder bump. An increased tin concentration may damage an under bump metallurgy layer between a lead-tin solder bump and a contact pad of an integrated circuit device.

Figure 3A:
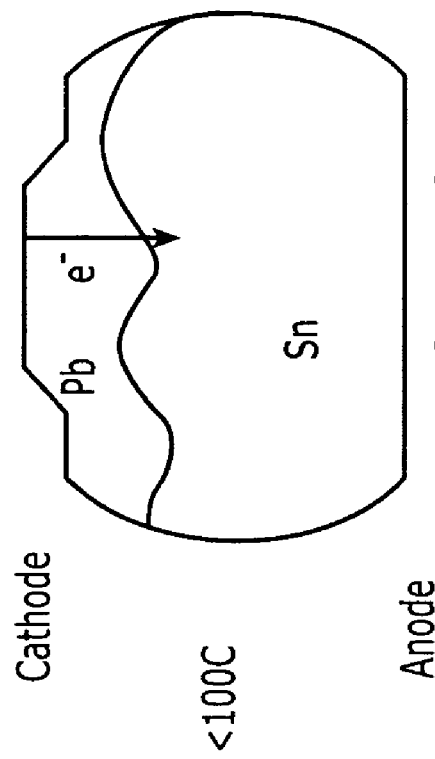
FIGS. 3A-B are cross sectional views illustrating power bumps according to embodiments of the present invention.
Figure 3B:
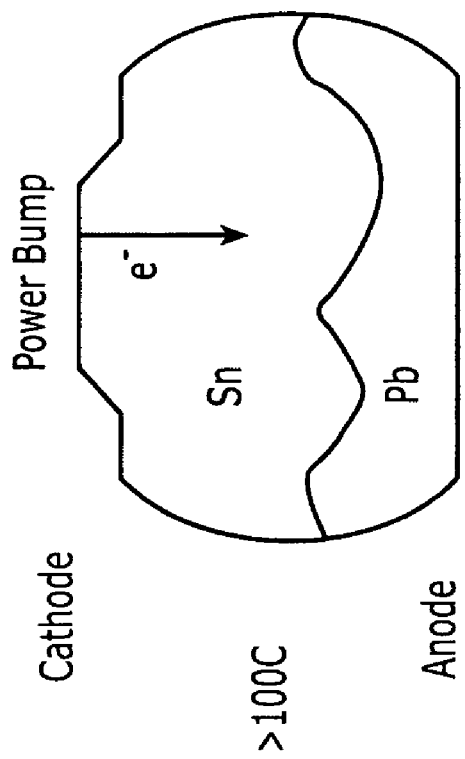

As shown in FIGS. 3A-B, a power bump may be connected between a power supply conductor (anode) of a printed circuit board and a Vcc pad (cathode) of an integrated circuit device. As shown in FIG. 3A, above approximately 100 degrees C., tin may segregate toward the Vcc pad of the integrated circuit device, and lead may segregate toward the power supply conductor of the printed circuit board. As shown in FIG. 3B, below approximately 100 degrees C., lead may segregate toward the Vcc pad of the integrated circuit device, and tin may segregate toward the power supply conductor of the printed circuit board. According to embodiments of the present invention, a plurality of power bumps may be provided for an integrated circuit device when operating conditions for the integrated circuit device are generally expected to exceed approximately 100 degrees C. For example, a plurality of redistribution lines may connect a respective plurality of solder bumps to a single power pad of the integrated circuit device.

If operating conditions for an integrated circuit device are generally expected to exceed approximately 100 degrees C., a number of power bumps provided for the integrated circuit device may exceed a number of ground bumps provided for the integrated circuit device. While particular embodiments of the present invention have been discussed with respect to binary solid solution solders such as lead-tin solders, other solid solution solders (including higher order solid solution solders) may be used. Moreover, binary and higher order intermetallic compound solders such as tin-silver and tin-silver-copper solders may also be used according to embodiments of the present invention.

Figure 5A:
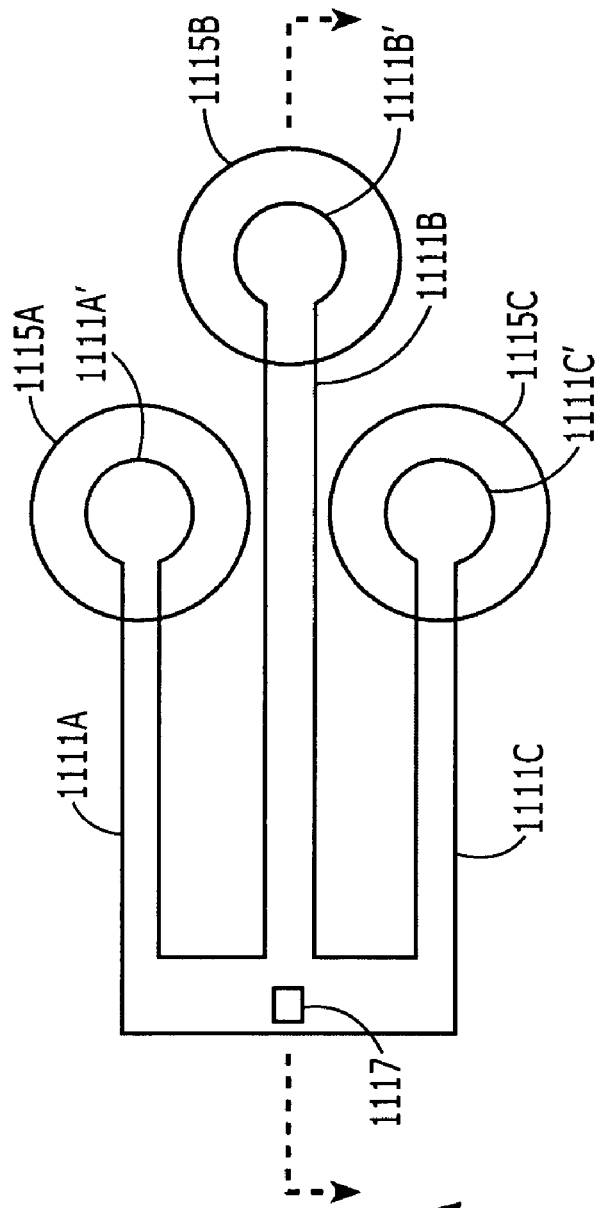
FIGS. 5A-B are respective top and cross sectional views illustrating multiple bumps connected to an input/output pad according to some embodiments of the present invention.
Figure 5B:
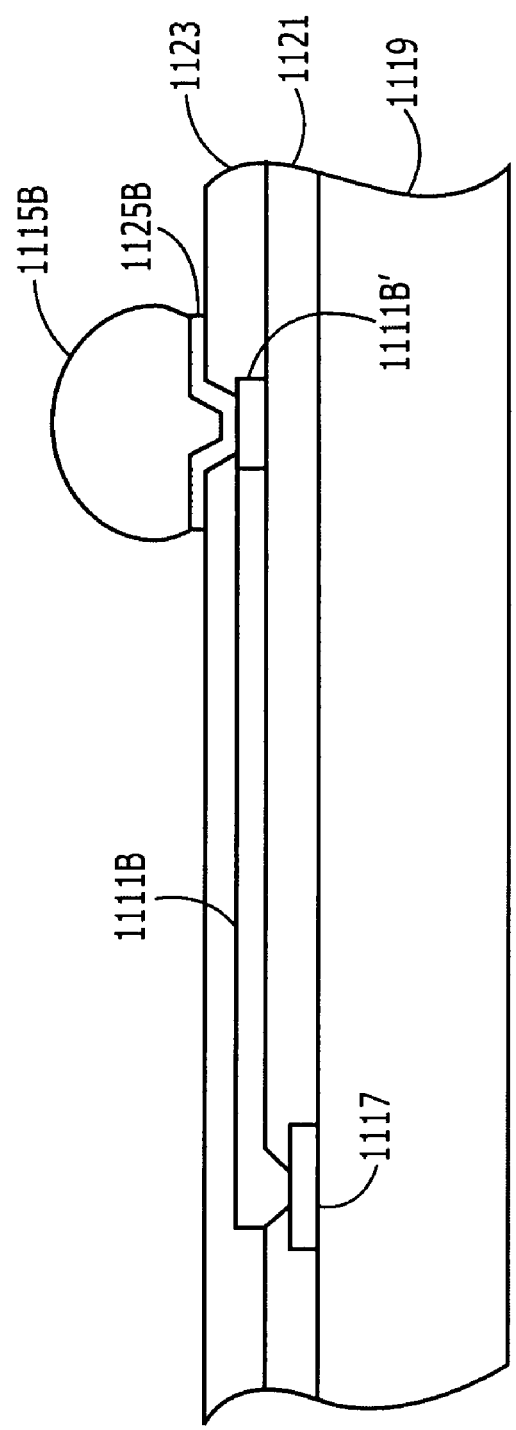

As shown in the top view of FIG. 5A and in the corresponding cross sectional view of FIG. 5B, for example, a plurality of redistribution lines 1111A-C may connect a respective plurality of solder bumps 1115A-C to a single Vcc pad 1117 of the integrated circuit device, and each redistribution line 1111A-C may include a respective pad portion 1111A', 1111B', and 1111C'. More particularly, the integrated circuit device may include a semiconductor substrate 1119, a first insulating layer 1121, and a second insulating layer 1123. The redistribution lines 1111A-C may be provided between the first and second insulating layers 1121 and 1123, and via holes in the second insulating layer 1123 may expose pad portions 1111A', 1111B', and 1111C' of the redistribution lines 1111A, 1111B, and 1111C. In addition, a respective under bump metallurgy layer 1125 may be provided between each of the solder bumps 1115A-C and the pad portions 1111A', 1111B', and 1111C' of the redistribution lines. The under bump metallurgy layer 1125B is shown in the cross sectional view of FIG. 5B.

In addition or in an alternative, a plurality of solder bumps may be connected to a respective plurality of Vcc pads. By providing a plurality of power bumps, current can be distributed, and segregation can be reduced. Moreover, failure of a single power bump may not be catastrophic.

While not shown in FIGS. 5A-B, one or more of the via holes through the insulating layer 1123 exposing conductive pads 1111A', 1111B', and/or 1111C' may have a non-circular perimeter as discussed below with respect to FIGS. 1A-C. More particularly, one or more of the via holes through the insulating layer 1123 exposing one or more of conductive pads 1111A', 1111B', and/or 1111C' may have a "D" shaped and/or a crescent shaped perimeter as discussed below with respect to FIGS. 1A-C.

Figure 4A:
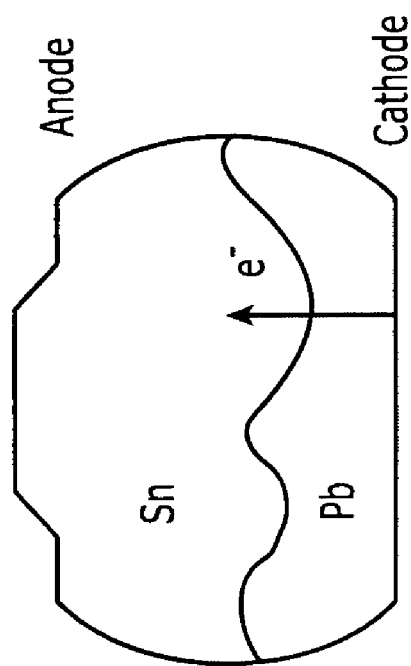
FIGS. 4A-B are cross sectional views illustrating ground bumps according to embodiments of the present invention.
Figure 4B:
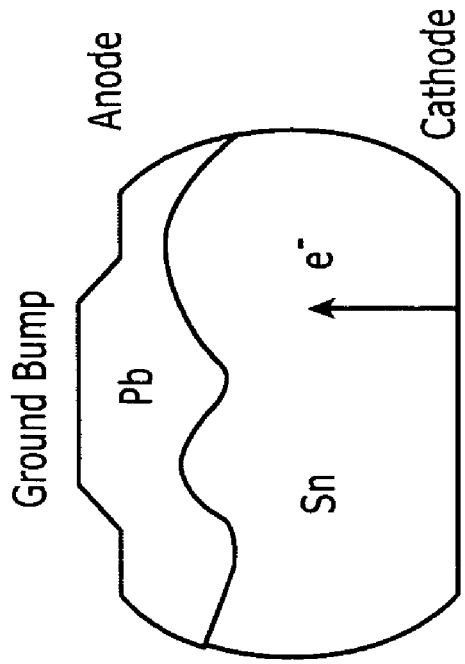

As shown in FIGS. 4A-B, a ground bump may be connected between a ground conductor (cathode) of a printed circuit board and a ground pad (anode) of an integrated circuit device. As shown in FIG. 4A, above approximately 100 degrees C., lead may segregate toward the ground pad of the integrated circuit device, and tin may segregate toward the ground conductor of the printed circuit board. As shown in FIG. 4B, below approximately 100 degrees C., tin may segregate toward the ground pad of the integrated circuit device, and lead may segregate toward the ground conductor of the printed circuit board. According to embodiments of the present invention, a plurality of ground bumps may be provided for an integrated circuit device when operating conditions for the integrated circuit device are generally expected not to exceed approximately 100 degrees C. For example, a plurality of redistribution lines may connect a respective plurality of solder bumps to a single ground pad of the integrated circuit device.

If operating conditions for an integrated circuit device are generally expected not to exceed approximately 100 degrees C., a number of ground bumps provided for the integrated circuit device may exceed a number of power bumps provided for the integrated circuit device. While particular embodiments of the present invention have been discussed with respect to binary solid solution solders such as lead-tin solders, other solid solution solders (including higher order solid solution solders) may be used. Moreover, binary and higher order intermetallic compound solders such as tin-silver and tin-silver-copper solders may also be used according to embodiments of the present invention.

Figure 6A:
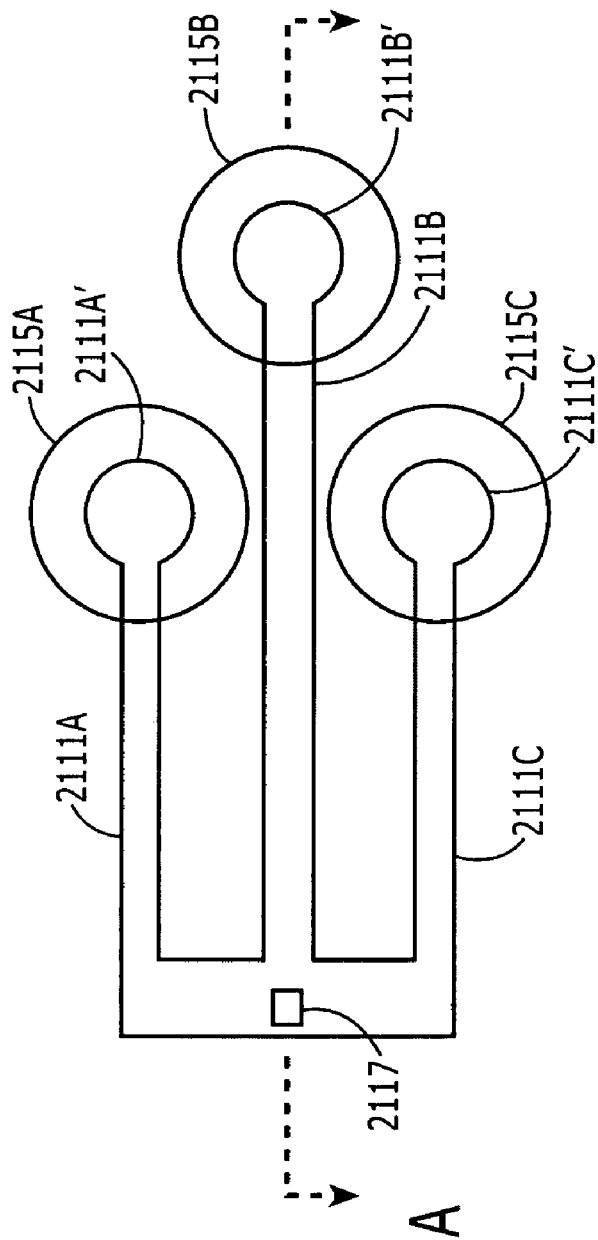
FIGS. 6A-B are respective top and cross sectional views illustrating multiple bumps connected to an input/output pad according to some other embodiments of the present invention.
Figure 6B:
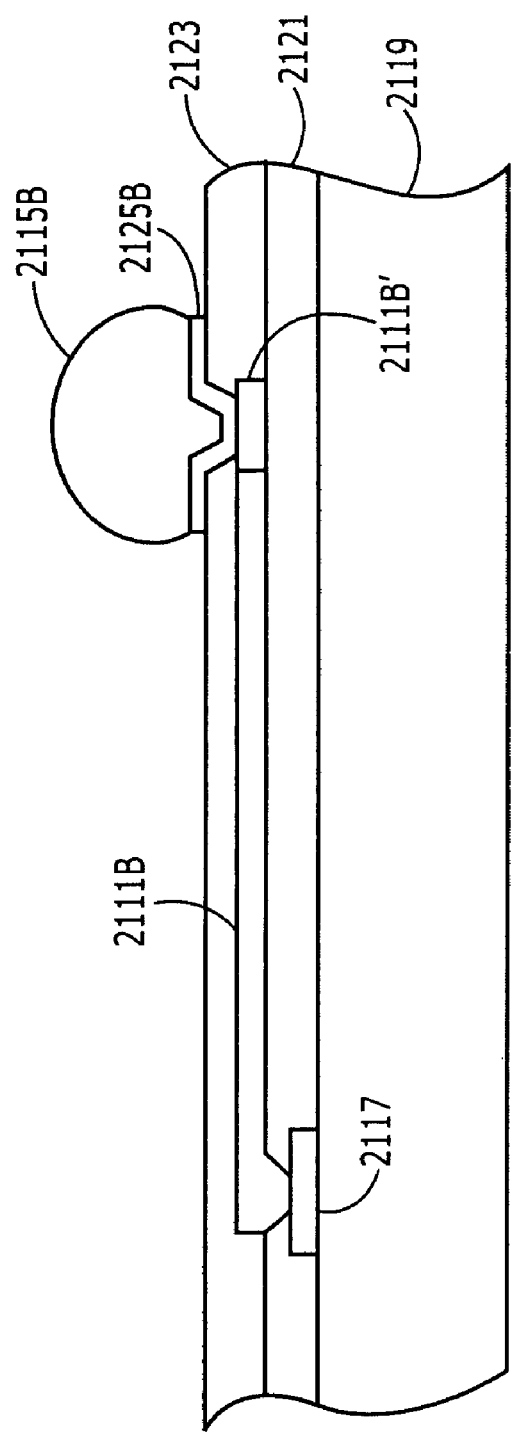

As shown in the top view of FIG. 6A and in the corresponding cross sectional view of FIG. 6B, for example, a plurality of redistribution lines 2111A-C may connect a respective plurality of solder bumps 2115A-C to a single ground pad 2117 of the integrated circuit device, and each redistribution line 2111A-C may include a respective pad portion 2111A', 2111B', and 2111C'. More particularly, the integrated circuit device may include a semiconductor substrate 2119, a first insulating layer 2121, and a second insulating layer 2123. The redistribution lines 2111A-C may be provided between the first and second insulating layers 2121 and 2123, and via holes in the second insulating layer 2123 may expose pad portions 2111A', 2111B', and 2111C' of the redistribution lines 2111A, 2111B, and 2111C. In addition, a respective under bump metallurgy layer 2125 may be provided between each of the solder bumps 2115A-C and the pad portions 2111A', 2111B', and 2111C' of the redistribution lines. The under bump metallurgy layer 2125B is shown in the cross sectional view of FIG. 6B.

While not shown in FIGS. 6A-B, one or more of the via holes through the insulating layer 2123 exposing conductive pads 2111A', 2111B', and/or 2111C' may have a non-circular perimeter as discussed below with respect to FIGS. 1A-C. More particularly, one or more of the via holes through the insulating layer 2123 exposing one or more of conductive pads 2111A', 2111B', and/or 2111C' may have a "D" shaped and/or a crescent shaped perimeter as discussed below with respect to FIGS. 1A-C.

In addition or in an alternative, a plurality of solder bumps may be connected to a respective plurality of ground pads. By providing a plurality of ground bumps, current can be distributed, and segregation can be reduced. Moreover, failure of a single ground bump may not be catastrophic.

Benefits may also be provided according to embodiments of the present invention by connecting a plurality of solder bumps to input/output pads other than ground and/or Vcc pads. As discussed above with respect to ground and Vcc pads, current can be distributed and segregation can be reduced, and failure of a single bump may not be catastrophic. Provision of multiple bumps may be particularly, beneficial with input/output pads carrying currents sufficient to result in accumulation of vacancies at interfaces between a solder bump and its under bump metallurgy. For example, provision of multiple bumps may be beneficial where relatively large DC currents are provided through a pad (such as a ground and/or Vcc pad). Provision of multiple bumps may also be beneficial where intermittent unidirectional currents are provided through a pad (such as a pad providing a Pulse Width Modulation signal) and/or where bi-directional currents which are predominate in one direction are provided through a pad (such as a pad providing a Pulse-Reverse Plating signal). In addition, provision of multiple bumps may be beneficial wherein sufficiently high AC currents are provided through a pad such that vacancies may accumulate at a solder bump interface during half cycles of the signal.

By providing a plurality of solder bumps connected to a same pad such as a ground pad, a Vcc pad, and/or an input/output pad, a device lifetime may be increased. More particularly, different resistances may be provided between the pad and each of the solder bumps connected to the pad so that, initially, current predominantly flows between the pad and a first solder bump connected through a path of least electrical resistance. Accordingly, vacancies (due to electromigration) may initially accumulate between the first solder bump and the respective under bump metallurgy layer, and vacancies may not substantially accumulate at a second solder bump connected through a path of higher resistance while the first solder bump is operational. The accumulation of vacancies at the first solder bump may eventually result in a void at the first solder bump and then failure of the first solder bump. Because significant current may not flow through the second solder bump until the first solder bump fails (due to the higher electrical resistance between the second solder bump and the pad), vacancies may not begin to significantly accumulate at the second solder bump until after failure of the first solder bump. An initiation of incubation of vacancies and/or voids in the second solder bump may thus be substantially delayed until after failure of the first solder bump. Stated in other words, initiation of a failure mechanism in the second solder bump may be substantially delayed until after failure of the first solder bump.

According to additional embodiments of the present invention, effects of electromigration can be reduced by providing a 'D' shaped via with a flat of the D facing the conductive line or trace (i.e. facing the incoming/outgoing current flow). This structure may reduce current crowding at a short path to a nearest point of a conventional circular via. In an alternative, the via can be concave and/or crescent shaped in the direction of the conductive line or trace (i.e. in the direction of the incoming/outgoing current flow.

As shown in the top view of FIG. 1A, a conductive line (or trace) 905 (such as a redistribution routing line) may be coupled to a circular conductive pad 903. The conductive line 905, for example, may provide electrical interconnection between the conductive pad 903 and an input/output pad of an integrated circuit device, and a solder bump may be electrically coupled to the conductive pad 903. Moreover, the conductive line 905 and pad 903 may be covered by a subsequently formed insulating layer, and a via hole 918 may be formed in the insulating layer so that edge (or peripheral) portions 903a of the pad 903 remain covered by the insulating layer and central (or interior) portions 903b are exposed by the via hole 918. Stated in other words, central (or interior) portions 903b of the conductive pad 903 may be free of the insulating layer.

As shown in FIG. 1A, a perimeter of the via hole 918 may have a "D" shape as illustrated by the segments 917 and 917'. Accordingly, a linear segment 917' of the perimeter of the "D" shaped via hole 918 may be adjacent and/or closest to the conductive line (or trace) 905. In an alternative, the perimeter of the via hole 918 may have a crescent shape as illustrated by the segments 917 and 917". Accordingly, a concave and/or crescent shaped segment 917" of the via hole 918 may be adjacent and/or closest to the conductive line 905.

According to some embodiments of the present invention, a first segment 917 of the perimeter of the via hole 918 may substantially define an arc of a circle around central portions of the conductive pad 903. In addition, a second segment 917' or 917" of the perimeter of the via hole 918 may substantially deviate from the circle around the central portion of the conductive pad 903. Moreover, the second segment 917' or 917" of the perimeter of the via hole 918 may be adjacent a connection between the conductive line 905 and the conductive pad 903. More particularly, the second segment of the perimeter of the via hole 918 may define a line as shown by the segment 917', and a length of the second segment 917' may be at least as great as a width of the conductive line. In an alternative, the second segment 917" of the perimeter of the via hole 918 may curve toward a center of the conductive pad 903. According to some other embodiments of the present invention, at least a segment of the perimeter of the via hole may be non-circular.

Figure 1B:
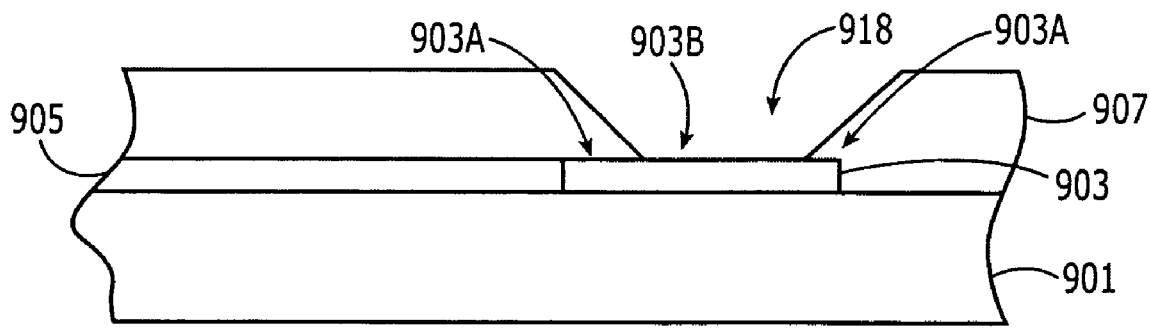
FIGS. 1B-C are cross sectional views illustrating conductive lines and pads according to embodiments of the present invention.

The cross sectional view of FIG. 1B illustrates the conductive line 905 and pad 903 in an electronic device including a substrate 901 and an insulating layer 907. The via hole 917 may expose a portion of the conductive pad 903B having a "D" shape and/or a crescent shape. Stated in other words, a perimeter of the via hole 918 may have a "D" shape and/or a crescent shape.

Figure 1C:
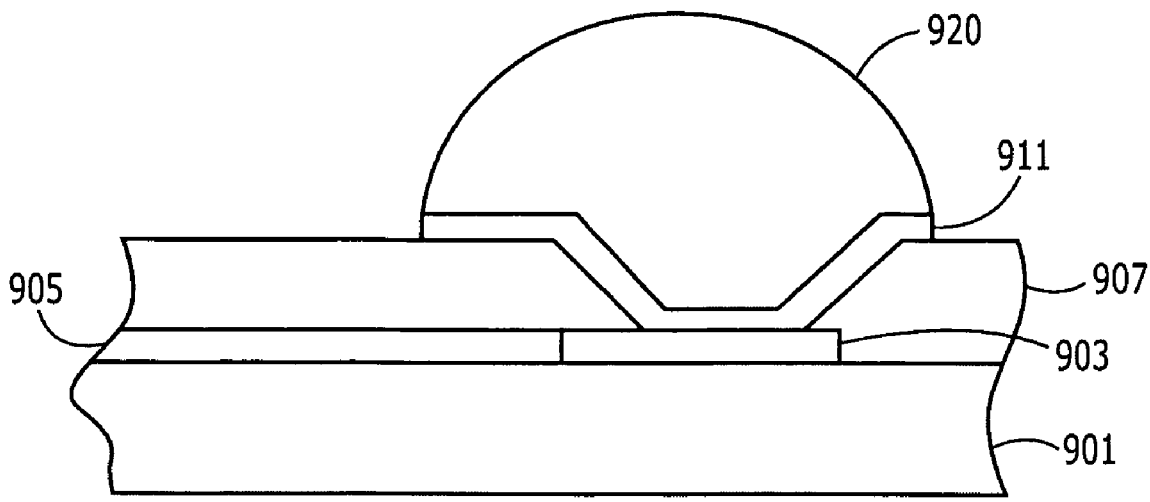

The cross sectional view of FIG. 1C illustrates the structure of FIG. 1B with the under bump metallurgy (UBM) layer 911 and solder bump 920 formed thereon. As shown in FIG. 1C, portions of the UBM layer 911 and the solder bump 920 may extend over portions of the insulating layer 907 outside the via hole. Accordingly, portions of the UBM layer 911 and the solder bump 920 extending on the insulating layer 907 may define a circle even though the via hole is not circular. Accordingly, a solder bump 920 having a circular footprint may be provided even though a perimeter of the via hole through the insulating layer 907 has a "D" shape and/or a crescent shape.

Elements of structures illustrated in FIGS. 1A-C may be formed as discussed, for example, in U.S. patent application Ser. No. 10/601,938 filed Jun. 23, 2003, the disclosure of which is hereby incorporated herein in its entirety by reference. For example, the conductive line 905 and pad 903 may include a patterned layer(s) of a conductive material(s) such as copper, aluminum, nickel, titanium, and/or combinations and/or alloys thereof. The UBM layer 911 may include one or more of an adhesion layer (such as a layer(s) of titanium, tungsten, chrome, and/or combinations and/or alloys thereof); a plating conduction layer (such as a layer of copper having a thickness in the range of approximately 0.1 to approximately 0.5 micrometers); a conductive shunt layer (such as a layer of copper having a thickness in the range of approximately 1.0 to approximately 5.0 micrometers); and/or a barrier layer (such as a layer(s) of nickel, platinum, palladium, and/or combinations and/or alloys thereof). The solder bump 920 may include lead-tin solder, but other solders may be used.

Figure 2B:
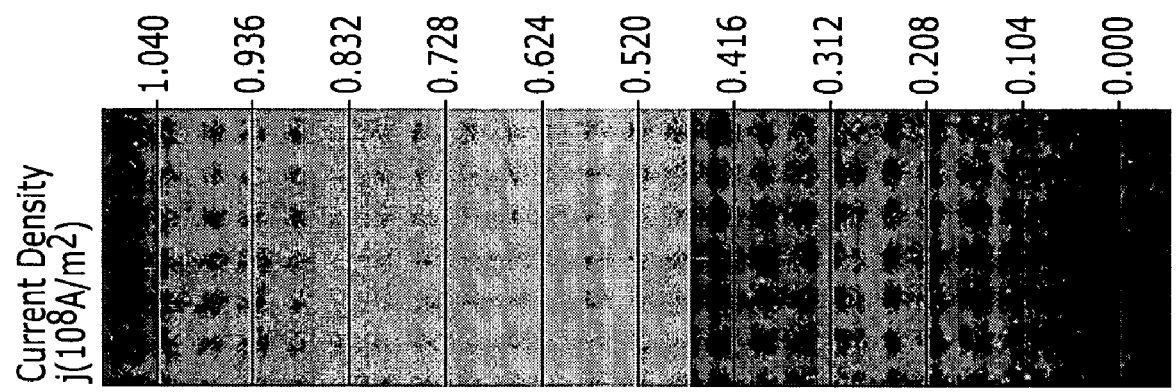
FIG. 2B is a mapping of greyscale shades from FIG. 2A with respect to current densities.
Figure 2A:
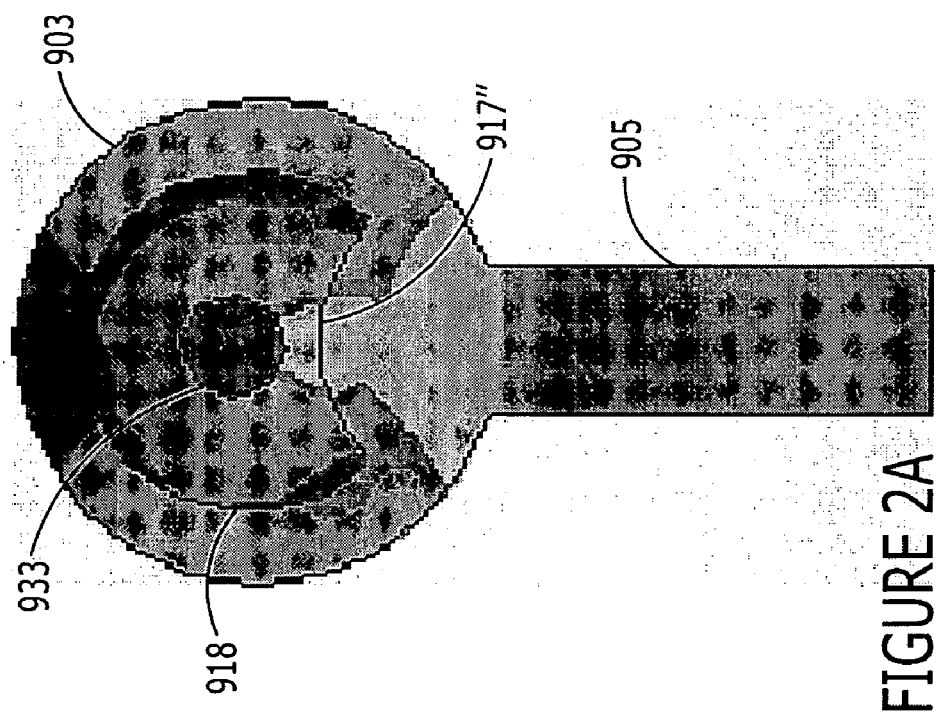
FIG. 2A is a top view illustrating current concentrations on a conductive line and pad according to embodiments of the present invention.

FIGS. 2A-B illustrate current concentrations from a conductive line 905 (for example, a redistribution line) to a conductive pad 903 exposed through a crescent shaped via hole 918 with a concave segment 917" of the crescent toward the current carrying conductive line 905. As shown in FIG. 2A, a concentration of current entering/leaving the solder bump through the conductive pad 903 may be reduced. As shown in FIG. 2A, a greatest concentration of current may be provided through the conductive line 905, and least concentrations of current may be provided at portions of the conductive pad 903 opposite the conductive line 905 and at a central portion 933 of the via hole. Greyscale shading between the conductive line 905 and the concave segment 917" of the crescent illustrates a spreading (reduced concentration) of current entering/leaving the solder bump relative to a pad with a via hole having a circular perimeter.

Particular embodiments of the present invention including "D" shaped and crescent shaped vias are discussed above with respect to FIGS. 1A-C and 2A-B by way of example. Vias having other shapes and/or deviating from the particular shapes of FIGS. 1A-C and 2A-B may be provided according to other embodiments of the present invention. For example, sharp transitions of the perimeter of the via may be rounded either intentionally and/or as a result of processing tolerances.

According to additional embodiments of the present invention, increased solder bump life may be provided by reserving backup bumps that pass little current until a respective primary bump fails. Because nucleation of voids proceeds at a rate slower than void growth, relatively little nucleation may occur in a backup bump until the primary bump fails, and void nucleation in the backup bump may not substantially begin until after failure of the first bump when the backup bump begins carrying significant current. More particularly, separate redistribution lines may be provided from an integrated circuit contact pad to primary and backup solder bumps, and the redistribution line to the backup solder bump may provide a higher resistance than the redistribution line to the primary solder bump so that during normal operation, the backup solder bump carries significantly less current than the primary solder bump. For example, the redistribution line to the backup solder bump may be narrower, thinner, and/or longer than the redistribution line to the primary solder bump. Accordingly, the redistribution line to the backup solder bump may provide a resistance sufficiently greater than that of the redistribution line to the primary solder bump so that the primary solder bump carries significantly more current during normal operations. The resistance of the redistribution line to the backup solder bump, however, is sufficiently low so that performance of the integrated circuit device is not significantly diminished on failure of the primary solder bump. A failure mechanism resulting from void nucleation and growth in the backup solder bump may thus not substantially begin until after failure of the primary solder bump.

While not shown in FIGS. 1A-C and 2A-B, the conductive line 905 may be coupled to an input/output pad on the substrate 901. The conductive line 905 may be coupled to an input/output pad as shown, for example, in FIGS. 5A-B, 6A-B, 7A-B, 8A-B, 9A-B, and/or 10A-B. Moreover, the conductive line 905 may be one of a plurality of conductive lines coupled to a same input/output pad so that there is a redundancy of electrical connection between a single input/output pad and a next level of packaging.

As shown in the top view of FIG. 7A and the cross sectional view of FIG. 7B, a relatively short conductive line (or trace) 7001 may be provided between input/output pad 7003 and primary solder bump 7005, and a relatively long conductive line (or trace) 7007 may be provided between input/output pad 7003 and backup solder bump 7009. The greater length of conductive line 7007 relative to conductive line 7001 may provide a lesser resistance between input/output pad 7003 and primary solder bump 7005 than between input/output pad 7003 and secondary solder bump 7009. Accordingly, current into and out of the input/output pad 7003 may flow primarily through conductive line 7001 and primary bump 7005 providing a path of least resistance. In the event of failure of a joint with the primary bump 7005, current may then pass through conductive line 7007 and secondary bump 7009.

As further shown in FIG. 7B, the conductive lines 7001 and 7007 may be provided between first and second insulating layers 7111 and 7115, and input/output pad 7003 may be provided between semiconductor substrate 7117 and first insulating layer 7111. Moreover, via holes in the second insulating layer 7115 may expose conductive pads 7001' and 7007' respectively connected to conductive lines 7001 and 7007, and under bump metallurgy layers 7121 and 7123 may be provided between solder bumps 7005 and 7009 and the respective conductive pads 7001' and 7007' of conductive lines 7001 and 7007.

While not shown in FIGS. 7A-B, one or both of the via holes through the insulating layer 7115 exposing conductive pads 7001' and/or 7007' may have a non-circular perimeter as discussed above with respect to FIGS. 1A-C. More particularly, one or both of the via holes through the insulating layer 7115 exposing conductive pads 7001' and/or 7007' may have a "D" shaped and/or a crescent shaped perimeter as discussed above with respect to FIGS. 1A-C.

Figure 8A:
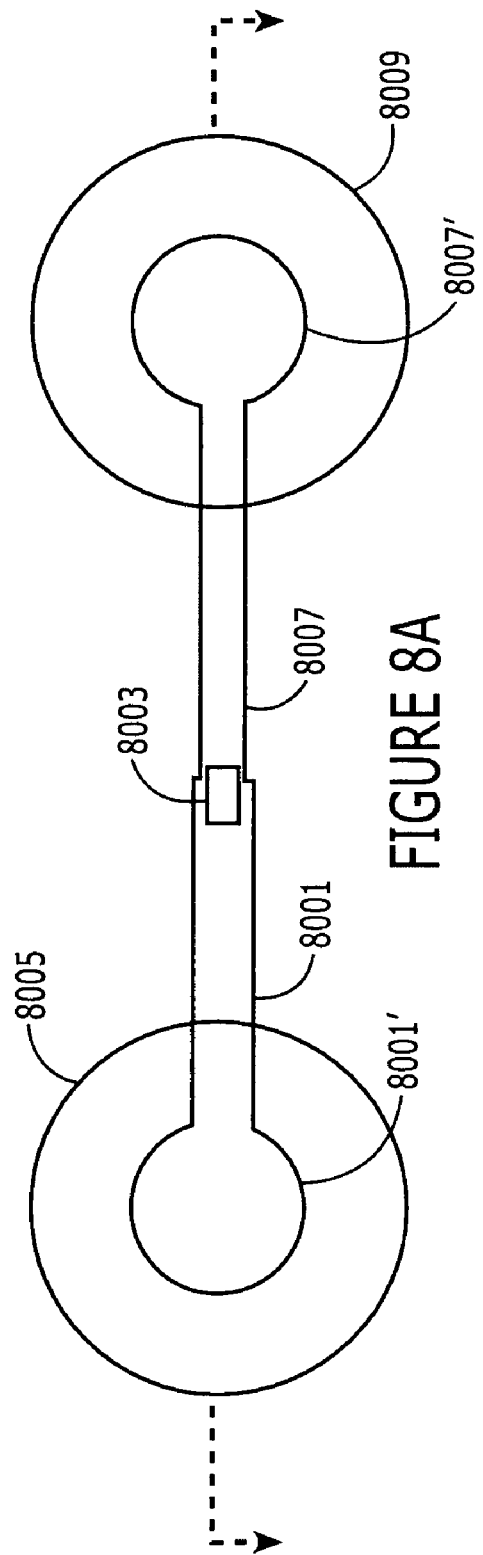
FIGS. 8A-B are respective top and cross sectional views illustrating multiple bumps connected to an input/output pad according to some more embodiments of the present invention.
Figure 8B:
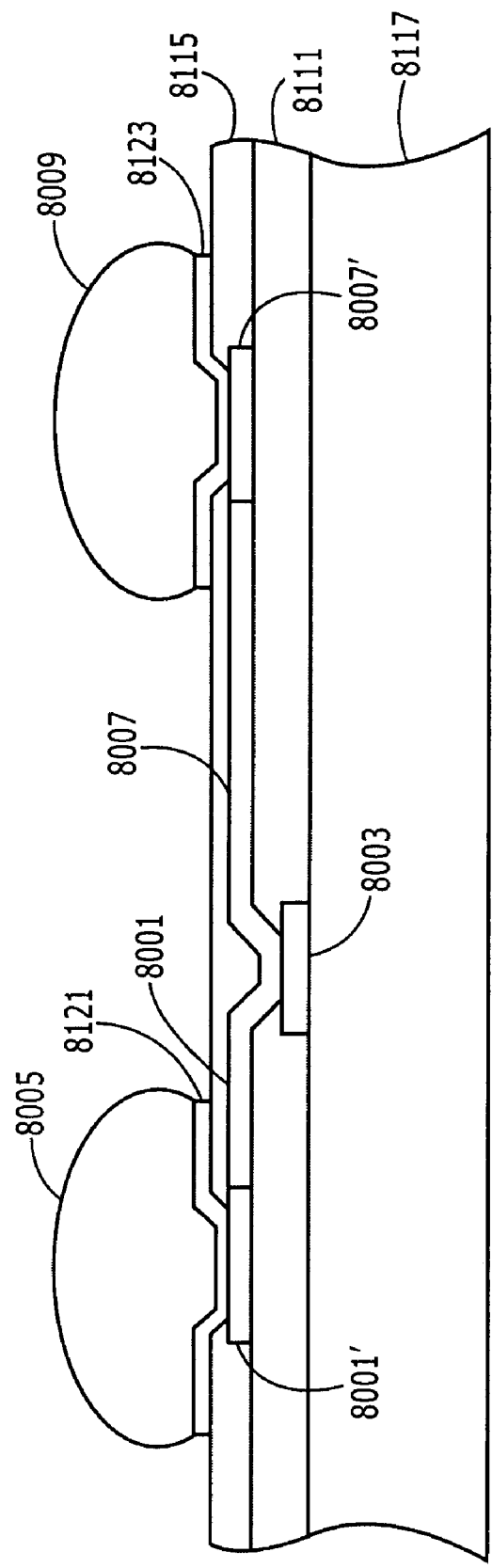

As shown in the top view of FIG. 8A and the cross sectional view of FIG. 8B, a relatively wide conductive line (or trace) 8001 may be provided between input/output pad 8003 and primary solder bump 8005, and a relatively narrow conductive line (or trace) 8007 may be provided between input/output pad 8003 and backup solder bump 8009. The greater width of conductive line 8007 relative to conductive line 8001 may provide a lesser resistance between input/output pad 8003 and primary solder bump 8005 than between input/output pad 8003 and secondary solder bump 8009. Accordingly, current into and out of the input/output pad 8003 may flow primarily through conductive line 8001 and primary bump 8005 providing a path of least resistance. In the event of failure of a joint with the primary bump 8005, current may then pass through conductive line 8007 and secondary bump 8009.

As further shown in FIG. 8B, the conductive lines 8001 and 8007 may be provided between first and second insulating layers 8111 and 8115, and input/output pad 8003 may be provided between semiconductor substrate 8117 and first insulating layer 8111. Moreover, via holes in the second insulating layer 8115 may expose conductive pads 8001' and 8007' respectively connected to conductive lines 8001 and 8007, and under bump metallurgy layers 8121 and 8123 may be provided between solder bumps 8005 and 8009 and the respective conductive pads 8001' and 8007' of conductive lines 8001 and 8007.

While not shown in FIGS. 8A-B, one or both of the via holes through the insulating layer 8115 exposing conductive pads 8001' and/or 8007' may have a non-circular perimeter as discussed above with respect to FIGS. 1A-C. More particularly, one or both of the via holes through the insulating layer 8115 exposing conductive pads 8001' and/or 8007' may have a "D" shaped and/or a crescent shaped perimeter as discussed above with respect to FIGS. 1A-C.

Figure 9A:
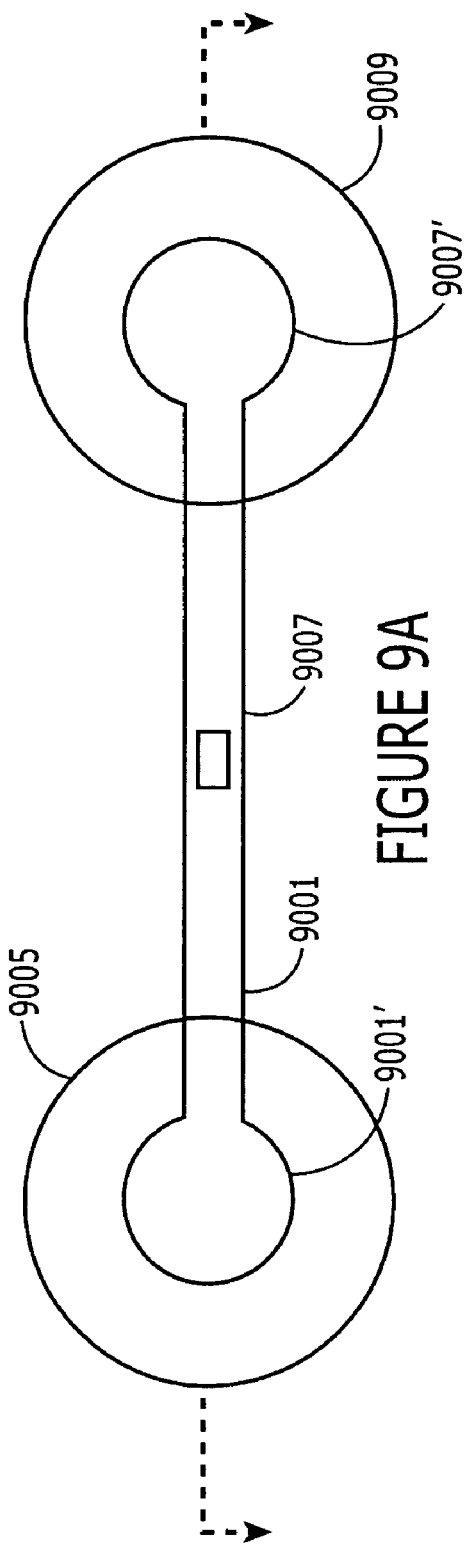
FIGS. 9A-B are respective top and cross sectional views illustrating multiple bumps connected to an input/output pad according to still more embodiments of the present invention.
Figure 9B:
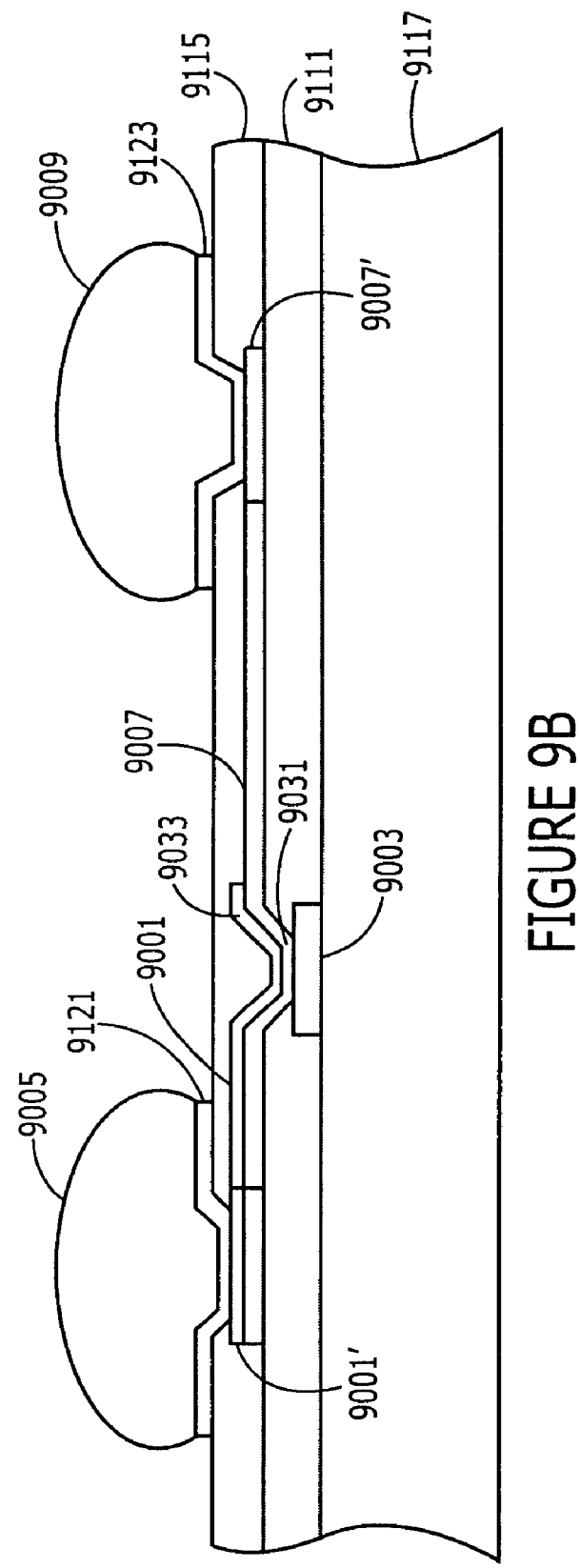

As shown in the top view of FIG. 9A and the cross sectional view of FIG. 9B, a relatively thick conductive line (or trace) 9001 may be provided between input/output pad 9003 and primary solder bump 9005, and a relatively thin conductive line (or trace) 9007 may be provided between input/output pad 9003 and backup solder bump 9009. The greater thickness of conductive line 9007 relative to conductive line 9001 may provide a lesser resistance between input/output pad 9003 and primary solder bump 9005 than between input/output pad 9003 and secondary solder bump 9009. Accordingly, current into and out of the input/output pad 9003 may flow primarily through conductive line 9001 and primary bump 9005 providing a path of least resistance. In the event of failure of a joint with the primary bump 9005, current may then pass through conductive line 9007 and secondary bump 9009. The primary and backup conductive lines may include a common conductive layer(s) 9031 which may be formed using a same deposition(s), and the primary conductive line may include an additional conductive layer(s) 9033 not included in the backup conductive line. In an alternative, layers of the primary and backup conductive lines may be separately formed to have different thicknesses. In yet another alternative, the primary and backup conductive lines may include different conductive materials providing different resistances.

As further shown in FIG. 9B, the conductive lines 9001 and 9007 may be provided between first and second insulating layers 9111 and 9115, and input/output pad 9003 may be provided between semiconductor substrate 9117 and first insulating layer 9111. Moreover, via holes in the second insulating layer 9115 may expose conductive pads 9001' and 9007' respectively connected to conductive lines 9001 and 9007, and under bump metallurgy layers 9121 and 9123 may be provided between solder bumps 9005 and 9009 and the respective conductive pads 9001' and 9007' of conductive lines 9001 and 9007. Moreover, elements of embodiments illustrated in FIGS. 7A-B, 8A-B, and 9A-B may be combined.

While not shown in FIGS. 9A-B, one or both of the via holes through the insulating layer 9115 exposing conductive pads 9001' and/or 9007' may have a non-circular perimeter as discussed above with respect to FIGS. 1A-C. More particularly, one or both of the via holes through the insulating layer 9115 exposing conductive pads 9001' and/or 9007' may have a "D" shaped and/or a crescent shaped perimeter as discussed above with respect to FIGS. 1A-C.

Figure 10A:
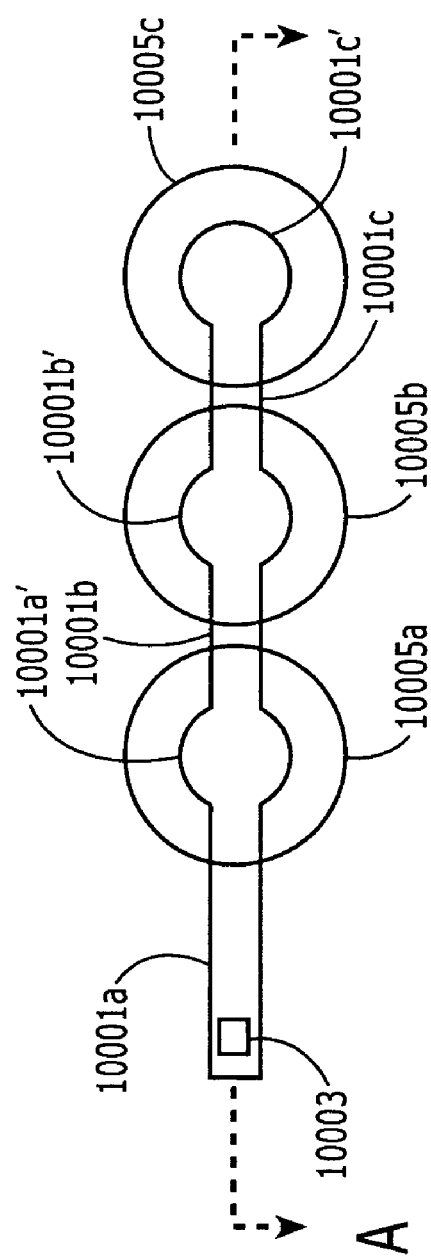
FIGS. 10A-B are respective top and cross sectional views illustrating multiple bumps connected to an input/output pad according to yet more embodiments of the present invention.
Figure 10B:
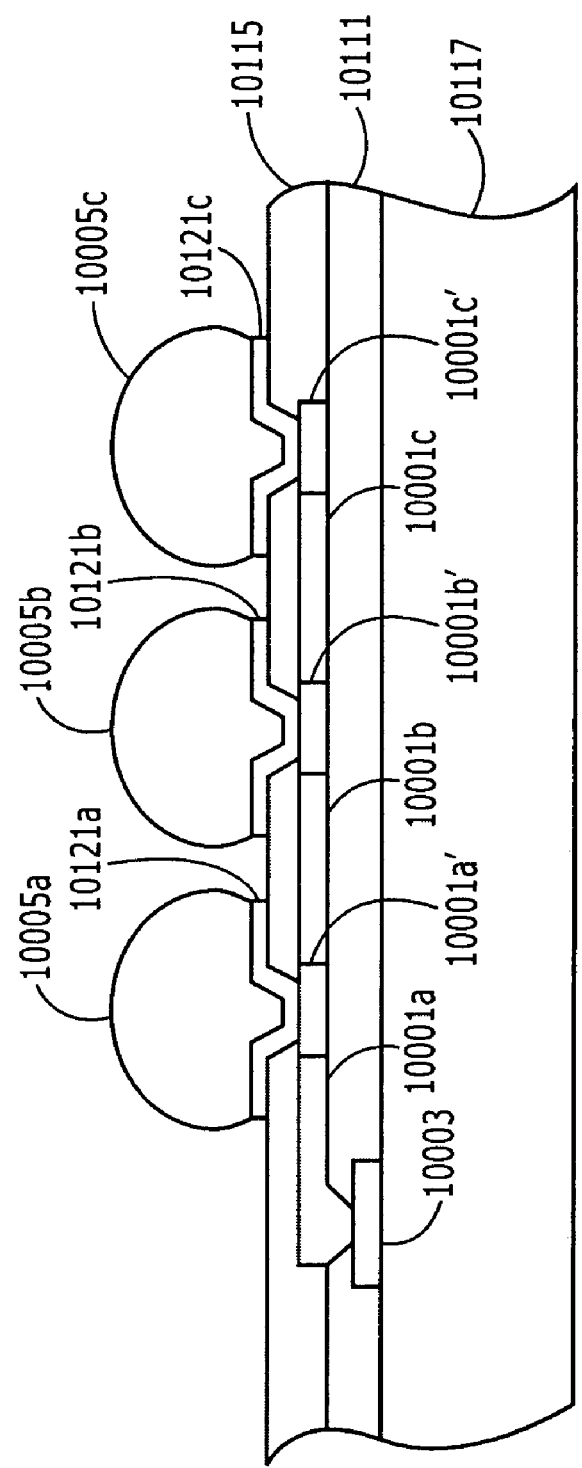

As shown in the top view of FIG. 10A and the cross sectional view of FIG. 10B, a plurality of solder bumps 10005*a-c* may be provided along a same conductive line (or trace) including segments 10001*a-c* connected to input/output pad 10003. The lesser distance between the solder bump 10005*a* and the input/output pad 10003 relative to the solder bumps 10005*b-c* may provide a lesser resistance between input/output pad 10003 and primary solder bump 10005*a* than between input/output pad 10003 and secondary solder bumps 10005*b* or 10005*c*. Accordingly, current into and out of the input/output pad 10003 may flow primarily through primary bump 10005*a* providing a path of least resistance. In the event of failure of a joint with the primary bump 10005*a*, current may then pass through conductive line segments 10001*a-b* and secondary bump 10005*b*. In the event of failure of a joint with the primary bump 10005*a* and the first secondary bump 10005*b*, current may then pass through conductive line segments 10001*a-c* and second secondary bump 10005*c*.

As further shown in FIG. 10B, the conductive line segments 10001*a-c* may be provided between first and second insulating layers 10111 and 10115, and input/output pad 10003 may be provided between semiconductor substrate 10117 and first insulating layer 10111. Moreover, via holes in the second insulating layer 10115 may expose conductive pads 10001*a'*, 10001*b'*, and 10001*c'* respectively connected to the conductive line including segments 10001*a-c*, and under bump metallurgy layers 10121*a-c* may be provided between solder bumps 10005*a-c* and the respective conductive pads 10001*a'-c'*.

Moreover, the different segments 10001*a-c* of the conductive line may have different properties to provided further increases in resistance between solder bumps more distantly located from the input/output pad 10003. For example, a width of the segment 10001*a* may be greater than a width of the segment 10001*b*, and/or a width of the segment 10001*b* may be greater than a width of the segment 10001*c*. In addition or in an alternative, a thickness of the segment 10001*a* may be greater than a thickness of the segment 10001*b*, and/or a thickness of the segment 10001*b* may be greater than a thickness of the segment 10001*c*. Moreover, a length of the segment 10001*a* may be less than a length of the segment 10001*b*, and/or a length of the segment 10001*b* may be less than a length of the segment 10001*c*.

While not shown in FIGS. 10A-B, one or both of the via holes through the insulating layer 10115 exposing conductive pads 10001*a'-c'* may have a non-circular perimeter as discussed above with respect to FIGS. 1A-C. More particularly, one or both of the via holes through the insulating layer 10115 exposing conductive pads 10001*a'-c'* may have a "D" shaped and/or a crescent shaped perimeter as discussed above with respect to FIGS. 1A-C.

As used herein, the term under bump metallurgy layer refers to one or more conductive layers provided between a solder bump and a substrate. An under bump metallurgy layer may include an adhesion layer (such as a layer of titanium, tungsten, chrome, and/or combinations thereof), a conduction layer (such as a layer of copper), and/or a barrier layer (such as a layer of nickel, platinum, palladium, and/or combinations thereof). A solder bump may be a bump of one or more different solder materials. For example, a solder bump may include one or more of a single element, binary, ternary, and/or higher order solder; such as a lead-tin solder, a lead-bismuth solder, a lead-indium solder, a lead free solder, a tin-silver solder, a tin-silver-copper solder, an indium-tin solder, an indium-gallium solder, a gallium solder, an indium-bismuth solder, a tin-bismuth solder, an indium-cadmium solder, bismuth-cadmium solder, tin-cadmium, etc. Accordingly, an under bump metallurgy layer may provide a surface that is wettable to a solder bump wherein the solder wettable surface of the under bump metallurgy layer and the solder bump comprise different materials.

While the present invention has been particularly shown and described with reference to embodiments thereof, it will be understood by those skilled in the art that various changes in form and details may be made therein without departing from the spirit and scope of the invention as defined by the appended claims and their equivalents.

That which is claimed is:

1. An integrated circuit device comprising:
   a substrate;
   a conductive pad on a surface of the substrate;
   a conductive line on the surface of the substrate wherein the conductive line is connected to the conductive pad and wherein the conductive line is narrow relative to the conductive pad in a direction parallel with respect to the surface of the substrate; and
   an insulating layer on the substrate, on the conductive line, and on edge portions of the conductive pad wherein the insulating layer has a hole therein exposing a central portion of the conductive pad, and wherein a first segment of a perimeter of the hole substantially defines an arc of a circle around the central portion of the conductive pad and wherein a second segment of the perimeter of the hole substantially deviates from the circle around the central portion of the conductive pad, and wherein the second segment of the perimeter of the hole is adjacent a connection between the conductive line and the conductive pad.

2. An integrated circuit device according to claim 1 further comprising:
a conductive bump on the central portion of the conductive pad and on portions of the insulating layer surrounding the hole so that the insulating layer is between the conductive bump and edge portions of the conductive pad.

3. An integrated circuit device according to claim 2 wherein the conductive bump comprises a solder bump.

4. An integrated circuit device according to claim 2 wherein the conductive bump has a substantially circular footprint on the insulating layer.

5. An integrated circuit device according to claim 2 further comprising:
an underbump metallurgy layer on the central portion of the conductive pad and on portions of the insulating layer surrounding the hole so that the under bump metallurgy layer is between the conductive bump and portions of the insulating layer surrounding the hole, and wherein the underbump metallurgy layer and the conductive bump comprise different materials.

6. An integrated circuit device according to claim 1 wherein the substrate comprises a semiconductor substrate having opposing first and second surfaces and wherein the conductive pad, the conductive line, and the insulating layer are on the first surface, wherein the conductive line and the edge portions of the conductive pad are between the insulating layer and the first surface, the integrated circuit device further comprising:
an input/output pad on the substrate wherein the conductive line provides electrical connection between the conductive pad and the input/output pad.

7. An integrated circuit device according to claim 6 wherein the conductive line comprises a first conductive line directly connected to the input/output pad, the integrated circuit device further comprising:
a second conductive line of the first surface of the semiconductor substrate wherein the second conductive line is directly connected to the input/output pad;
a second conductive pad on the first surface of the semiconductor substrate wherein the second conductive pad is directly connected to the second conductive line wherein the insulating layer has a second hole therein exposing a central portion of the second conductive pad;
a first conductive bump on the central portion of the first conductive pad and on portions of the insulating layer surrounding the first hole; and
a second conductive bump on the central portion of the second conductive pad and on portions of the insulating layer surrounding the second hole.

8. An integrated circuit device according to claim 1 wherein the second segment of the perimeter of the hole substantially defines a line.

9. An integrated circuit device according to claim 8 wherein a length of the second segment is at least as great as a width of the conductive line.

10. An integrated circuit device according to claim 1 wherein the second segment of the perimeter of the hole curves toward the center of the conductive pad.

11. An integrated circuit device comprising:
a substrate having first and second opposing surfaces;
a conductive pad on the first surface of the substrate;
a conductive line on the first surface of the substrate wherein the conductive line is connected to the conductive pad and wherein the conductive line is narrow relative to the conductive pad;
an insulating layer on the first surface of the substrate, on the conductive line, and on edge portions of the conductive pad wherein the insulating layer has a hole therein exposing a central portion of the conductive pad and wherein at least a segment of a perimeter of the hole is non-circular and wherein the perimeter of the hole is defined in a plane parallel with respect to the first surface of the substrate; and
a conductive bump on the central portion of the conductive pad and on portions of the insulating layer surrounding the hole so that the insulating layer is between the conductive bump and edge portions of the conductive pad and wherein the conductive bump has a substantially circular footprint on the insulating layer.

12. An integrated circuit device according to claim 11 wherein the conductive bump comprises a solder bump.

13. An integrated circuit device according to claim 11 further comprising:
an underbump metallurgy layer on the central portion of the conductive pad and on portions of the insulating layer surrounding the hole so that the under bump metallurgy layer is between the conductive bump and portions of the insulating layer surrounding the hole, and wherein the underbump metallurgy layer and the conductive bump comprise different materials.

14. An integrated circuit device according to claim 11 wherein a first segment of a perimeter of the hole substantially defines an arc of a circle around the central portion of the conductive pad and wherein a second segment of the perimeter of the hole substantially deviates from the circle around the central portion of the conductive pad.

15. An integrated circuit device according to claim 14 wherein the second segment of the perimeter of the hole is adjacent a connection between the conductive line and the conductive pad.

16. An integrated circuit device according to claim 14 wherein the second segment of the perimeter of the hole substantially defines a line.

17. An integrated circuit device according to claim 16 wherein a length of the second segment is at least as great as a width of the conductive line.

18. An integrated circuit device according to claim 14 wherein the second segment of the perimeter of the hole curves toward the center of the conductive pad.

19. An integrated circuit device according to claim 11 wherein the substrate comprises a semiconductor substrate, the integrated circuit device further comprising:
an input/output pad on the first surface of the semiconductor substrate wherein the conductive line provides electrical connection between the conductive pad and the input/output pad.

20. An integrated circuit device according to claim 19 wherein the conductive line comprises a first conductive line directly connected to the input/output pad, the integrated circuit device further comprising:
a second conductive line on the first surface of the semiconductor substrate wherein the second conductive line is directly connected to the input/output pad;
a second conductive pad directly connected to the second conductive line wherein the insulating layer has a second hole therein exposing a central portion of the second conductive pad wherein edge portions of the first and second conductive pads are between the insulating layer and the first surface of the semiconductor substrate;

a first conductive bump on the central portion of the first conductive pad and on portions of the insulating layer surrounding the first hole; and a second conductive bump on the central portion of the second conductive pad and on portions of the insulating layer surrounding the second hole.

21. An integrated circuit device comprising
a semiconductor substrate having first and second opposing surfaces;
an input/output pad on the first surface of the semiconductor substrate;
first and second conductive lines on the first surface of the semiconductor substrate wherein both of the first and second conductive lines are directly connected to the input/output pad;
first and second conductive pads on the first surface of the semiconductor substrate wherein the first conductive pad is directly connected to the first conductive line and wherein the second conductive pad is directly connected to the second conductive line;
an insulating layer on the first and second conductive lines and on edge portions of the first and second conductive pads wherein the insulating layer has first and second holes therein exposing central portions of the respective first and second conductive pads so that the edge portions of the first and second conductive pads are between the insulating layer and the semiconductor substrate;
a first conductive bump on the central portion of the first conductive pad and on portions of the insulating layer surrounding the first hole; and
a second conductive bump on the central portion of the second conductive pad and on portions of the insulating layer surrounding the second hole.

22. An integrated circuit device according to claim 21 wherein the first and second conductive bumps comprise respective first and second solder bumps.

23. An integrated circuit device according to claim 21 wherein each of the first and second conductive bumps has a substantially circular footprint on the insulating layer.

24. An integrated circuit device according to claim 21 further comprising:
a first underbump metallurgy layer on the central portion of the first conductive pad and on portions of the insulating layer surrounding the first hole so that the first under bump metallurgy layer is between the first conductive bump and portions of the insulating layer surrounding the first hole wherein the first underbump metallurgy layer and the first conductive bump comprise different materials; and
a second underbump metallurgy layer on the central portion of the second conductive pad and on portions of the insulating layer surrounding the second hole so that the second under bump metallurgy layer is between the second conductive bump and portions of the insulating layer surrounding the second hole wherein the second underbump metallurgy layer and the second conductive bump comprise different materials.

25. An integrated circuit device according to claim 21 wherein the first conductive line provides a first electrical resistance between the input/output pad and the first conductive pad, wherein the second conductive line provides a second electrical resistance between the input/output pad and the second conductive pad, and wherein the first and second electrical resistances are different.

26. An integrated circuit device according to claim 25 wherein the first conductive line has a first length between the input/output pad and the first conductive pad, wherein the second conductive line has a second length between the input/output pad and the second conductive pad, and wherein the first and second lengths are different.

27. An integrated circuit device according to claim 25 wherein the first conductive line has a first width, wherein the second conductive line has a second width, and wherein the first and second widths are different.

28. An integrated circuit device according to claim 25 wherein the first conductive line has a first thickness, wherein the second conductive line has a second thickness, and wherein the first and second thicknesses are different.

29. An integrated circuit device according to claim 25 wherein the first conductive line comprises a first material, wherein the second conductive line comprises a second material, and wherein the first and second materials are different.

30. An integrated circuit device according to claim 21 wherein the input/output pad comprises a ground pad providing a ground connection for the integrated circuit device.

31. An integrated circuit device according to claim 21 wherein the input/output pad comprises a power pad providing a power connection for the integrated circuit device.

32. An integrated circuit device according to claim 21 wherein the first conductive line is narrow relative to the first conductive pad, and wherein a first segment of a perimeter of the first hole substantially defines an arc of a circle around the central portion of the first conductive pad and wherein a second segment of the perimeter of the first hole substantially deviates from the circle around the central portion of the conductive pad, wherein the second segment of the perimeter of the first hole is adjacent a connection between the conductive line and the conductive pad, and wherein the perimeter of the first hole is defined in a plane parallel with respect to the first surface of the substrate.

33. An integrated circuit device according to claim 21 wherein at least a segment of a perimeter of the first hole is non-circular.

34. An integrated circuit device according to claim 21 wherein the first and second conductive lines are configured such that the first conductive bump fails due to electromigration before the second conductive bump fails.

35. An integrated circuit device according to claim 1 wherein the substrate comprises a semiconductor substrate.

36. An integrated circuit device according to claim 35 wherein the conductive line is narrow relative to the conductive pad in a dimension parallel with respect to a surface of the semiconductor substrate, and wherein the perimeter of the hole including the first and second segments is defined in a plane parallel with respect to the surface of the semiconductor substrate.

37. An integrated circuit device according to claim 11 wherein the substrate comprises a semiconductor substrate.

38. An integrated circuit device according to claim 3 wherein the solder bump comprises lead-tin solder, lead-bismuth solder, lead-indium solder, tin-silver solder, tin-silver-copper solder, indium-tin solder, indium-gallium solder, gallium solder, indium-bismuth solder, tin-bismuth solder, indium-cadmium solder, bismuth-cadmium solder, and/or tin-cadmium solder.

39. An integrated circuit device according to claim 12 wherein the solder bump comprises lead-tin solder, lead-bismuth solder, lead-indium solder, tin-silver solder, tin-silver-copper solder, indium-tin solder, indium-gallium solder, gallium solder, indium-bismuth solder, tin-bismuth solder, indium-cadmium solder, bismuth-cadmium solder, and/or tin-cadmium solder.

40. An integrated circuit device according to claim 22 wherein each of the first and second solder bumps comprises lead-tin solder, lead-bismuth solder, lead-indium solder, tin-silver solder, tin-silver-copper solder, indium-tin solder, indium-gallium solder, gallium solder, indium-bismuth solder, tin-bismuth solder, indium-cadmium solder, bismuth-cadmium solder, and/or tin-cadmium solder.

* * * * *

UNITED STATES PATENT AND TRADEMARK OFFICE
CERTIFICATE OF CORRECTION

PATENT NO. : 7,531,898 B2
APPLICATION NO. : 11/270366
DATED : May 12, 2009
INVENTOR(S) : Batchelor et al.

It is certified that error appears in the above-identified patent and that said Letters Patent is hereby corrected as shown below:

Title Page 4, line 29, Other Publications continued, right column "Greer":
Please correct "Eutectect" to read -- Eutectec --

Signed and Sealed this

Twenty-eighth Day of July, 2009

JOHN DOLL
*Acting Director of the United States Patent and Trademark Office*